(12) United States Patent
Fujimoto

(10) Patent No.: US 7,833,867 B2
(45) Date of Patent: Nov. 16, 2010

(54) SEMICONDUCTOR DEVICE AND METHOD FOR MANUFACTURING THE SAME

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 185 days.

(21) Appl. No.: 12/292,008

(22) Filed: Nov. 10, 2008

(65) Prior Publication Data

US 2009/0121284 A1    May 14, 2009

(30) Foreign Application Priority Data

Nov. 12, 2007  (JP) ............................. 2007-293343

(51) Int. Cl.
    *H01L 21/336* (2006.01)
(52) U.S. Cl. ..................................... 438/294
(58) Field of Classification Search .................. 438/294
    See application file for complete search history.

(56) References Cited

U.S. PATENT DOCUMENTS

| 5,960,300 | A | 9/1999 | Yabu et al. | |
|---|---|---|---|---|
| 6,143,626 | A | 11/2000 | Yabu et al. | |
| 6,346,457 | B1 | 2/2002 | Kawano | |
| 6,413,802 | B1 * | 7/2002 | Hu et al. | 438/151 |
| 6,951,784 | B1 * | 10/2005 | Anderson et al. | 438/157 |
| 7,407,845 | B2 * | 8/2008 | Lee et al. | 438/157 |
| 7,642,589 | B2 * | 1/2010 | Son et al. | 257/302 |
| 2002/0011612 | A1 * | 1/2002 | Hieda | 257/262 |
| 2004/0061191 | A1 * | 4/2004 | Paton et al. | 257/412 |
| 2004/0217420 | A1 * | 11/2004 | Yeo et al. | 257/347 |
| 2004/0262698 | A1 * | 12/2004 | Nowak | 257/401 |
| 2005/0093082 | A1 * | 5/2005 | Son et al. | 257/401 |
| 2005/0104096 | A1 * | 5/2005 | Lee et al. | 257/288 |
| 2007/0190741 | A1 * | 8/2007 | Lindsay | 438/424 |
| 2008/0081404 | A1 * | 4/2008 | Barna et al. | 438/197 |
| 2008/0311732 | A1 * | 12/2008 | Dokumaci et al. | 438/525 |

FOREIGN PATENT DOCUMENTS

| JP | 64-008670 | 1/1989 |
|---|---|---|
| JP | 08-227935 | 9/1996 |
| JP | 2000-277604 A | 10/2000 |
| JP | 2001-102439 A | 4/2001 |
| JP | 2001-298194 A | 10/2001 |
| JP | 2002-118255 A | 4/2002 |
| JP | 2002-190536 A | 7/2002 |
| JP | 2005-229107 A | 8/2005 |

* cited by examiner

*Primary Examiner*—N Drew Richards
*Assistant Examiner*—Grant S Withers
(74) *Attorney, Agent, or Firm*—Foley & Lardner LLP

(57) ABSTRACT

A sacrifice oxide film is formed in a Fin semiconductor substrate portion, and impurities are then implanted in the semiconductor substrate through a mask pattern as a mask. Thereafter, the sacrifice oxide film is removed to expose the semiconductor substrate. A gate insulating film is then formed on the exposed semiconductor substrate.

14 Claims, 24 Drawing Sheets

A-A'

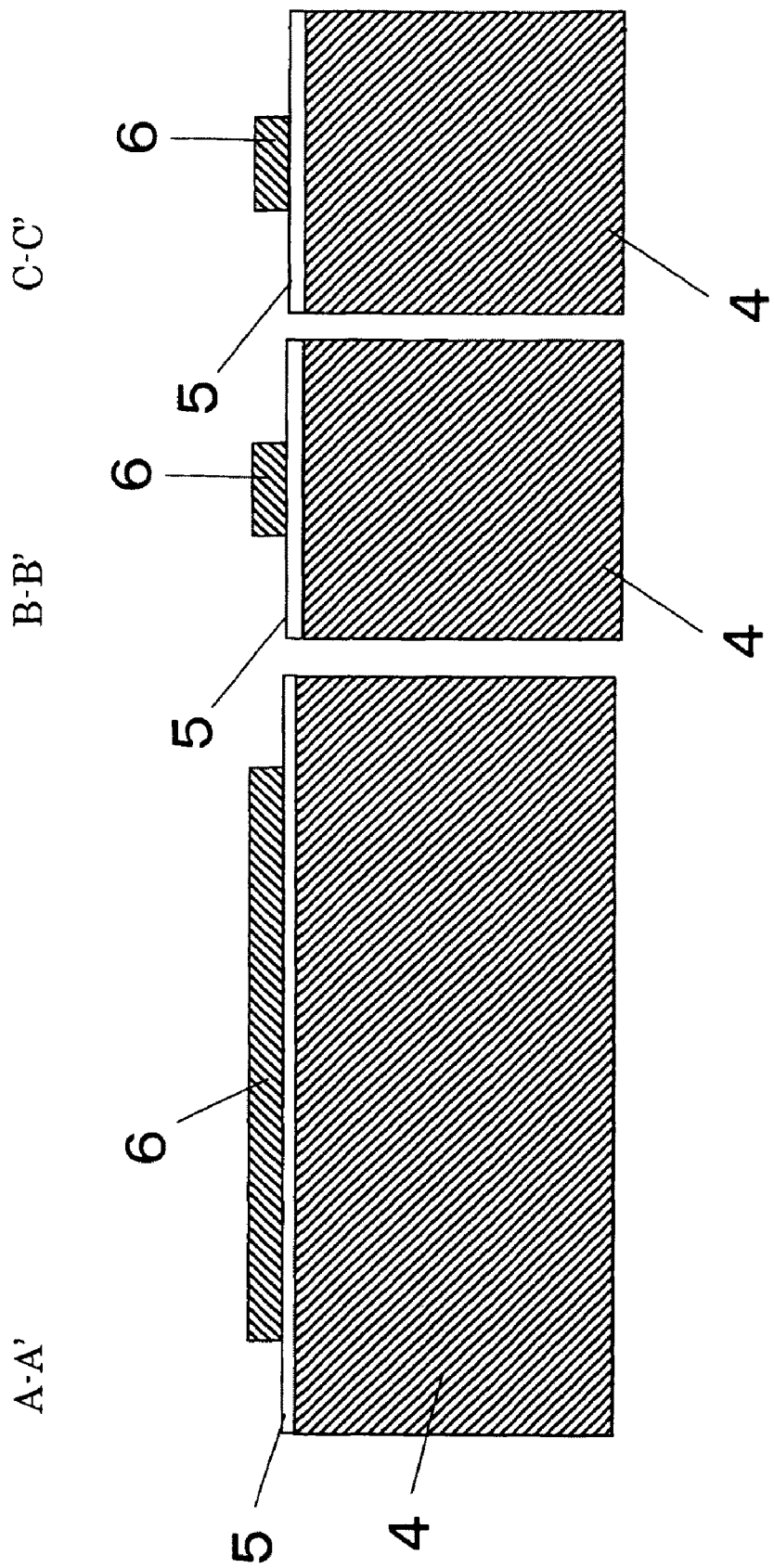

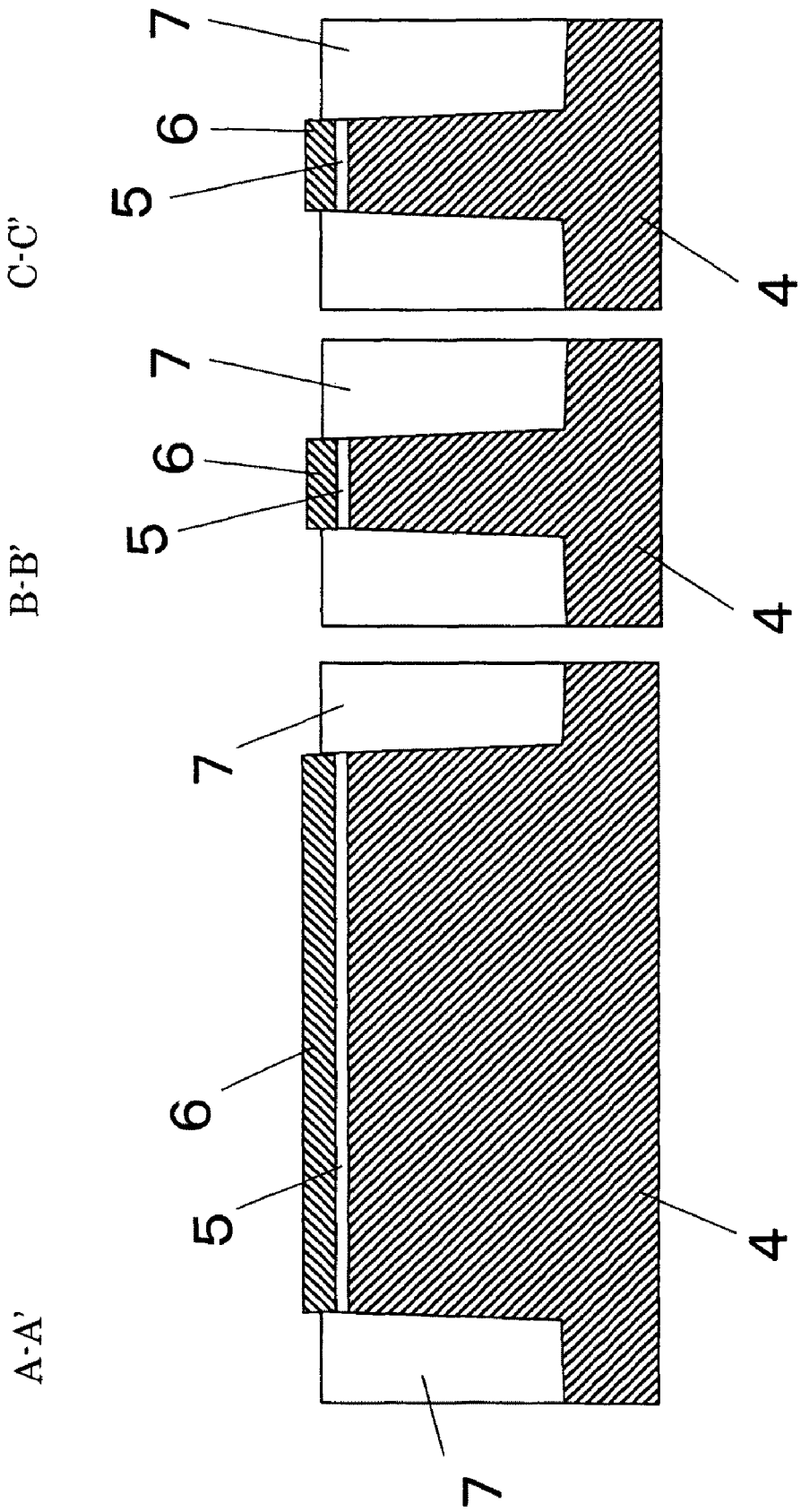

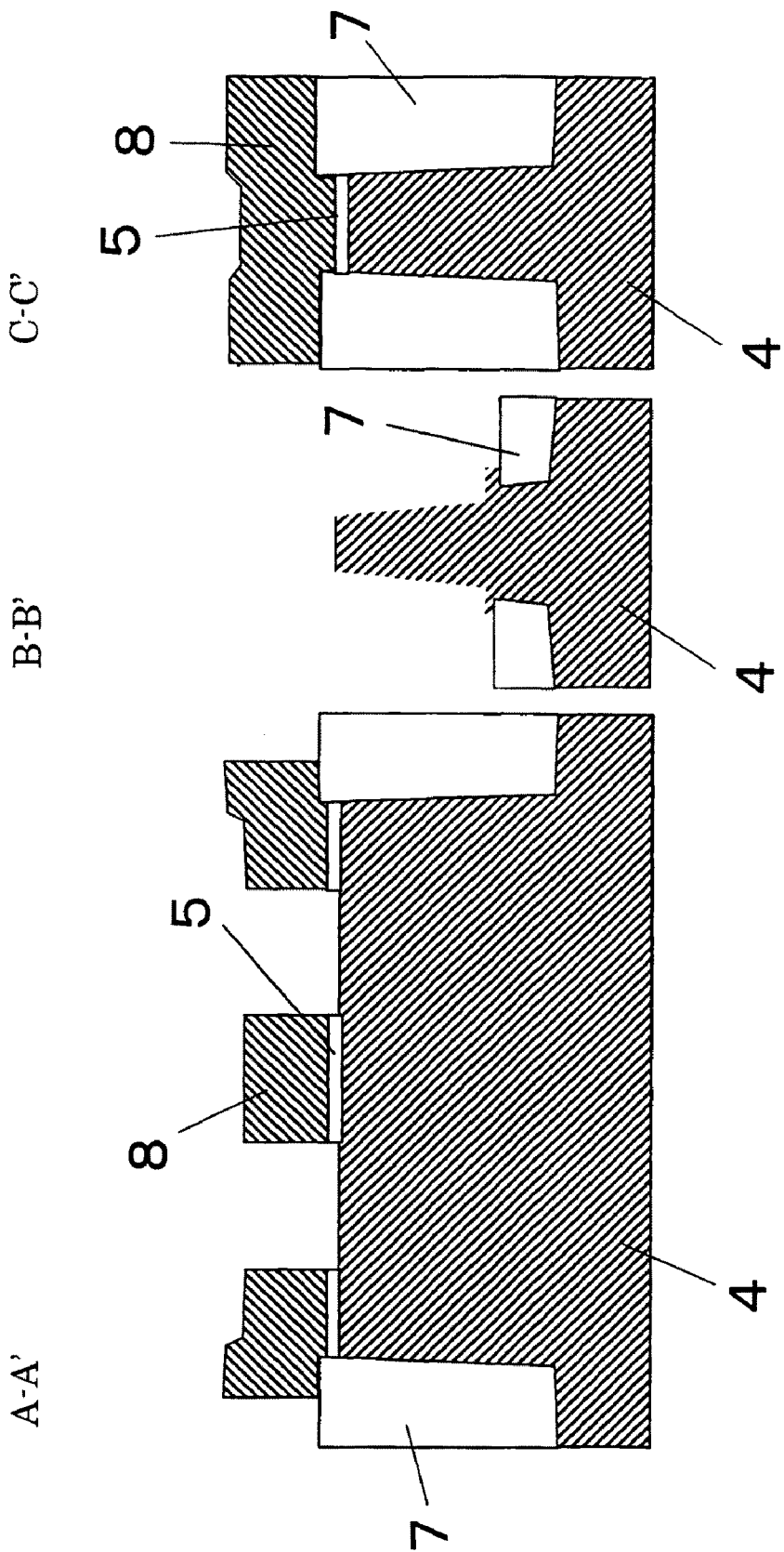

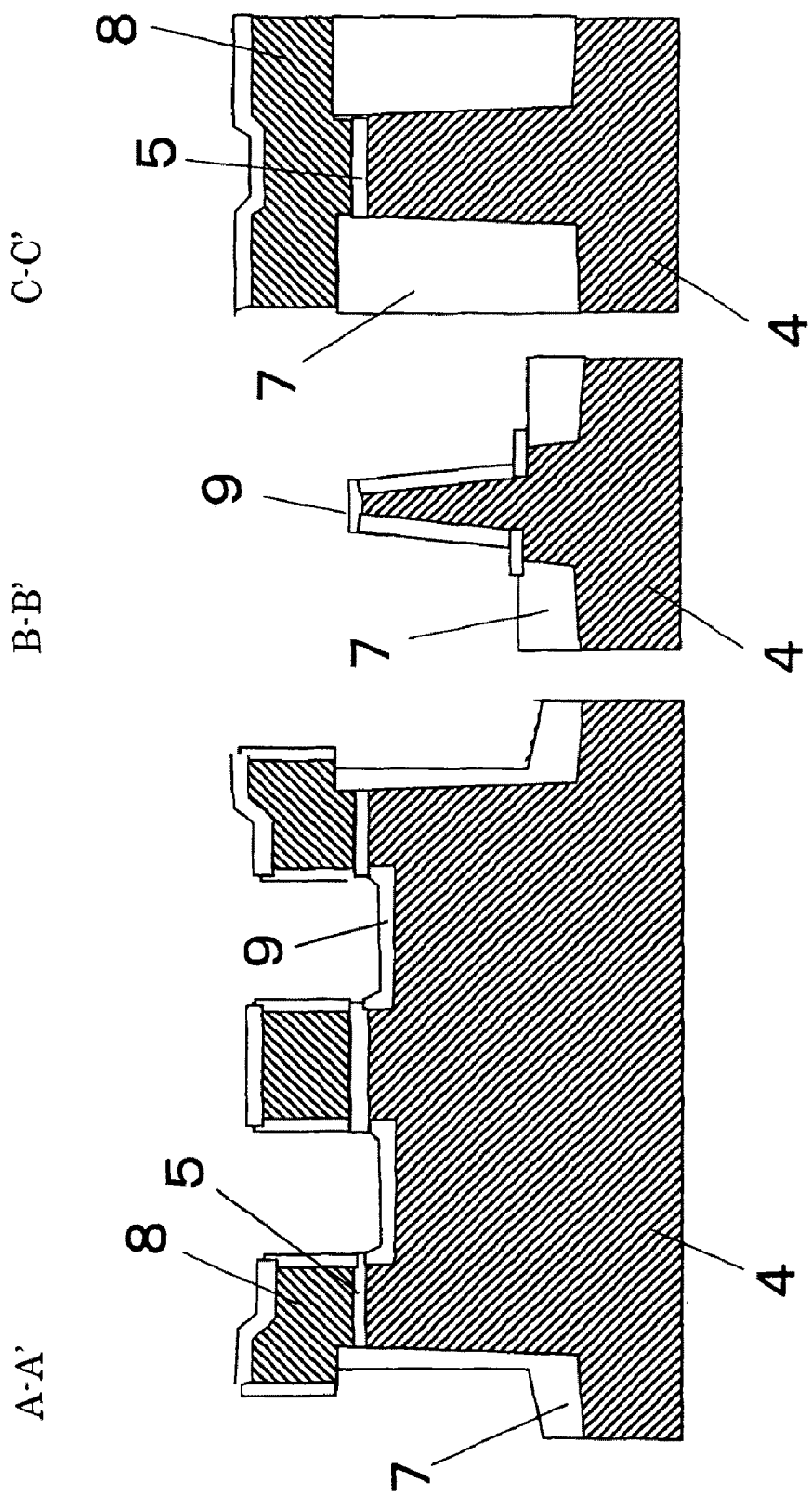

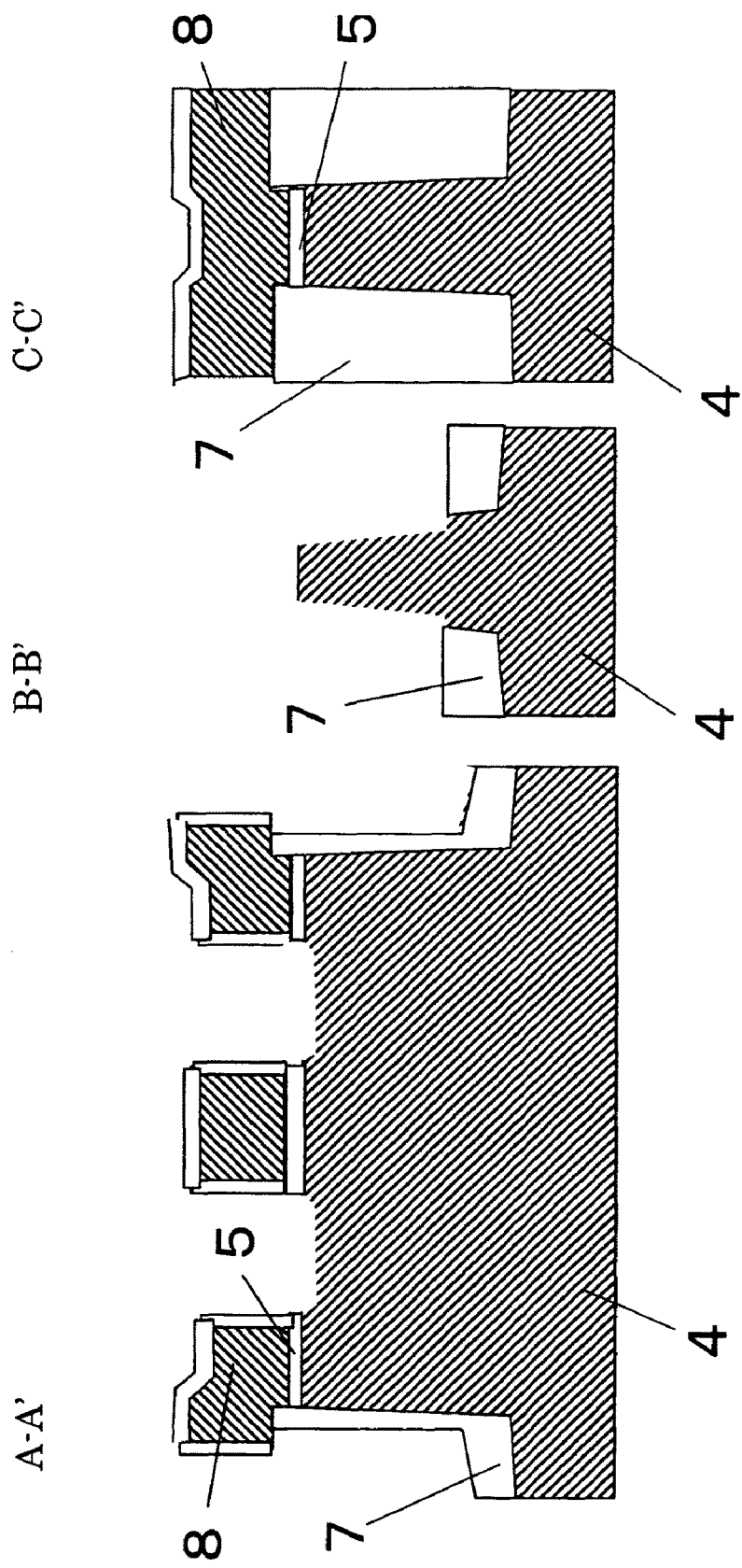

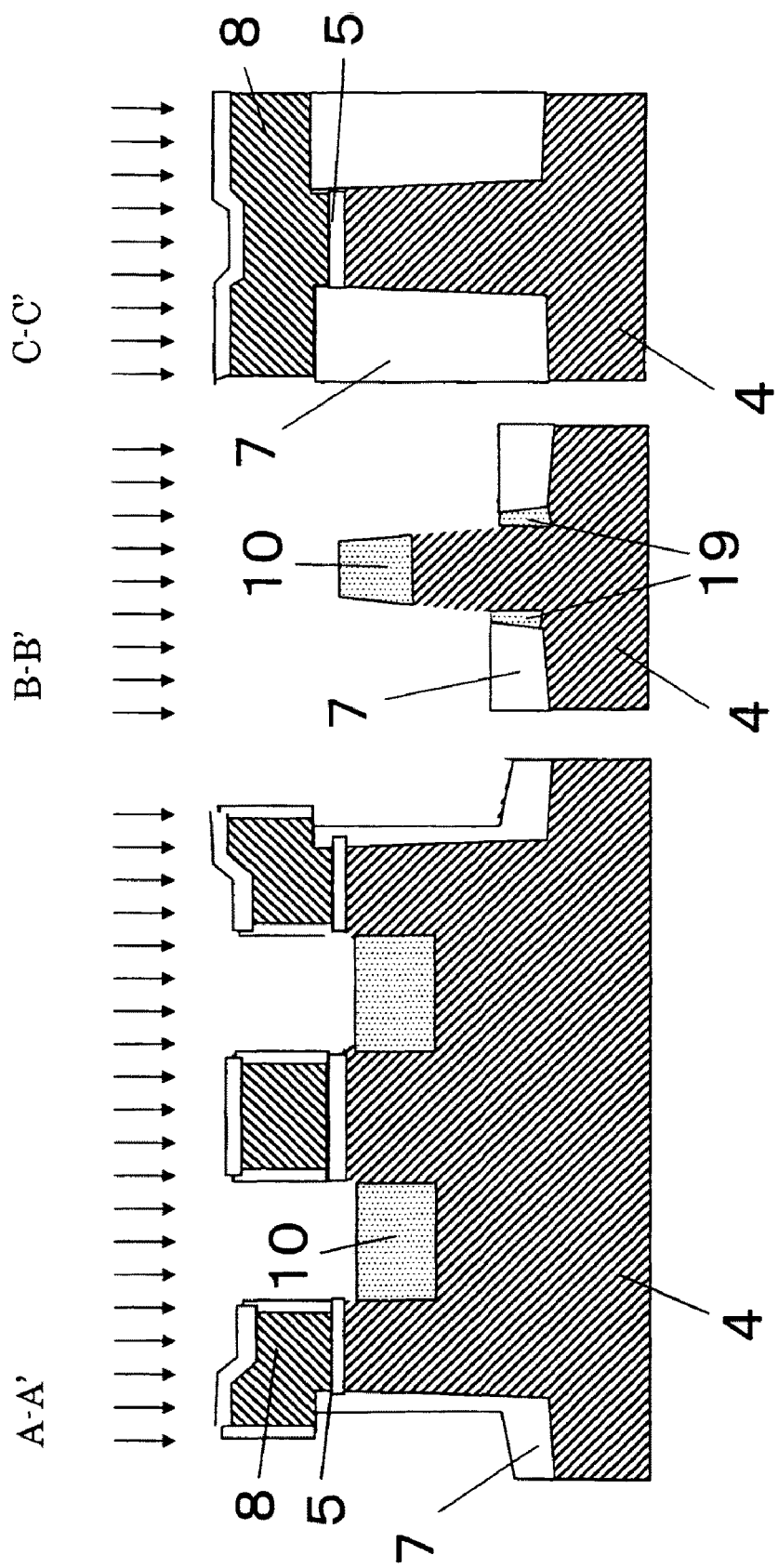

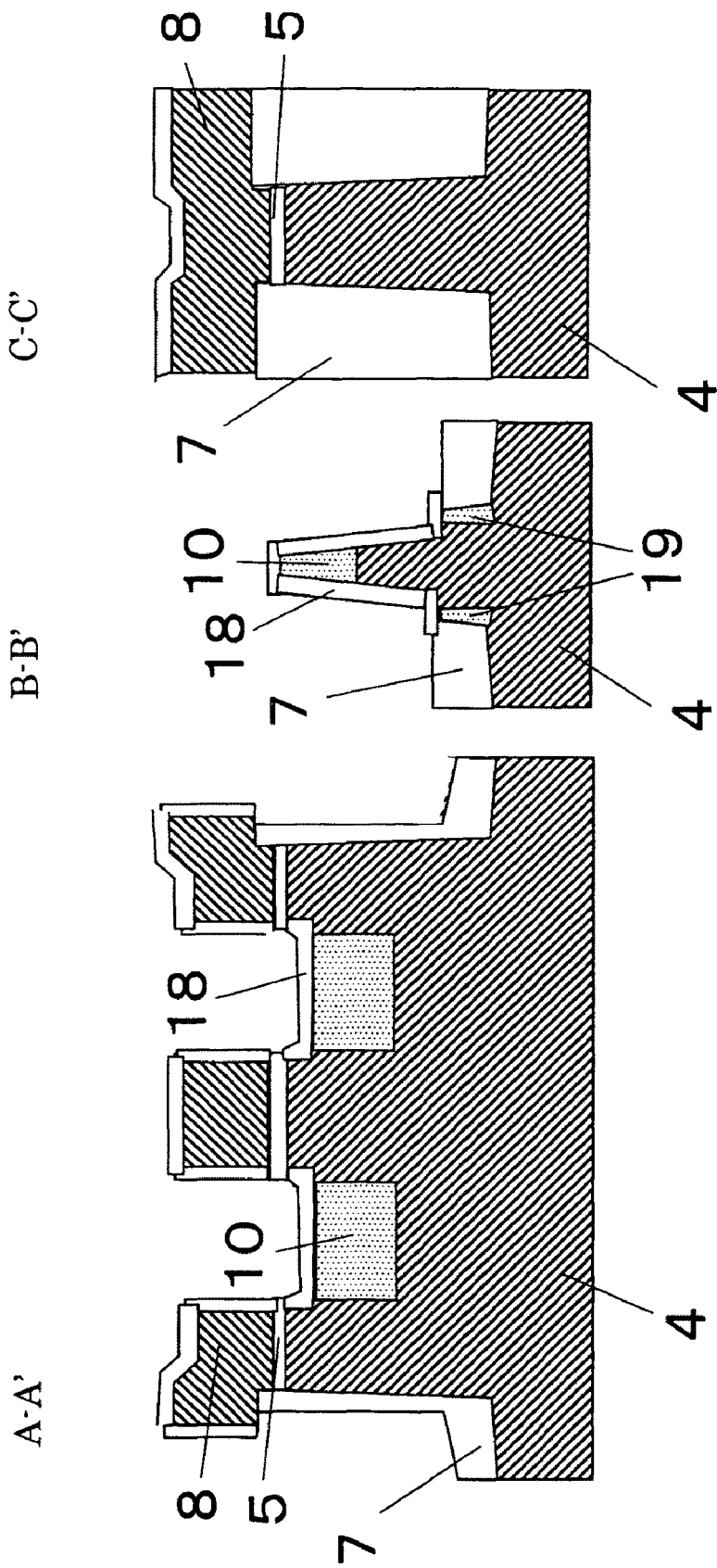

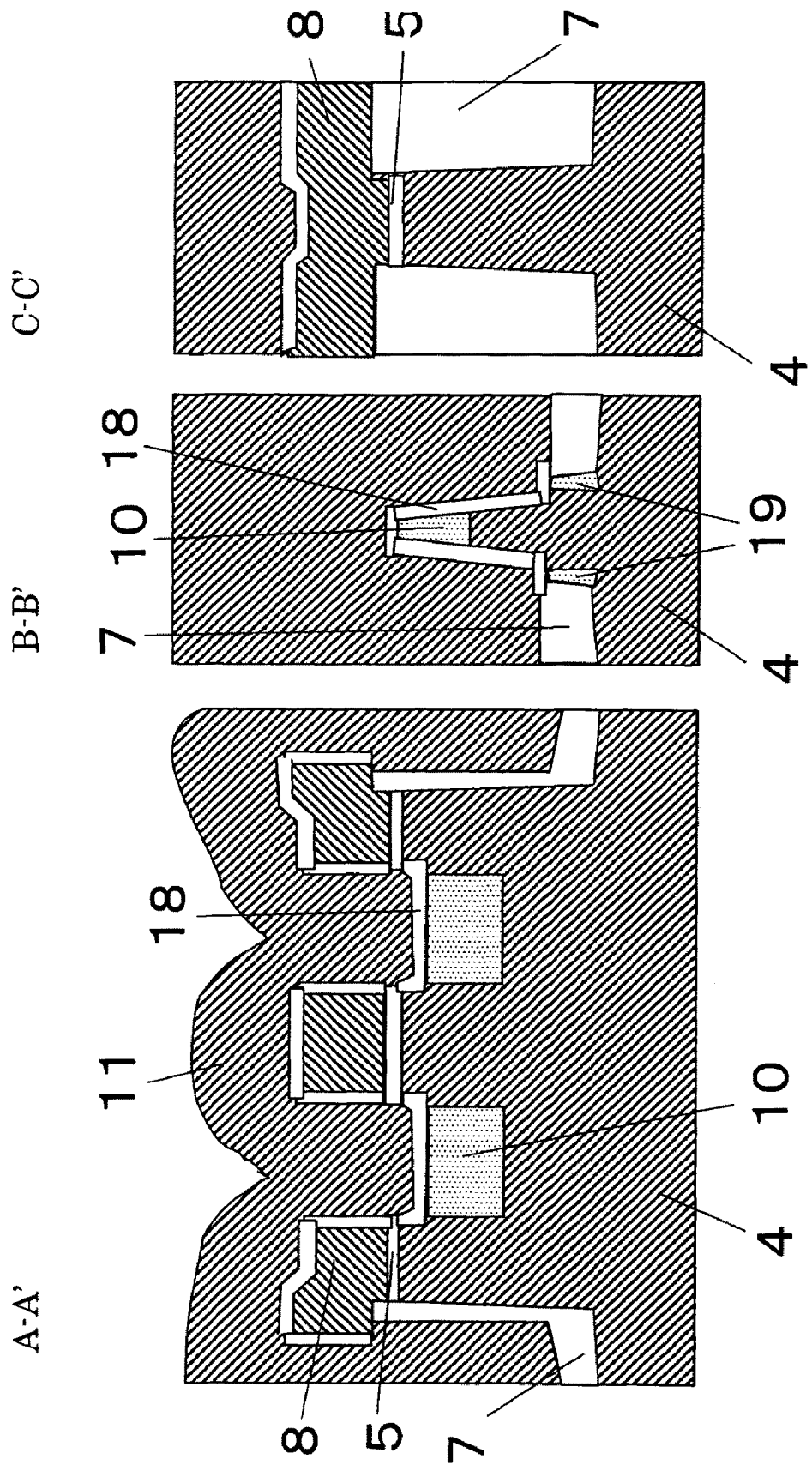

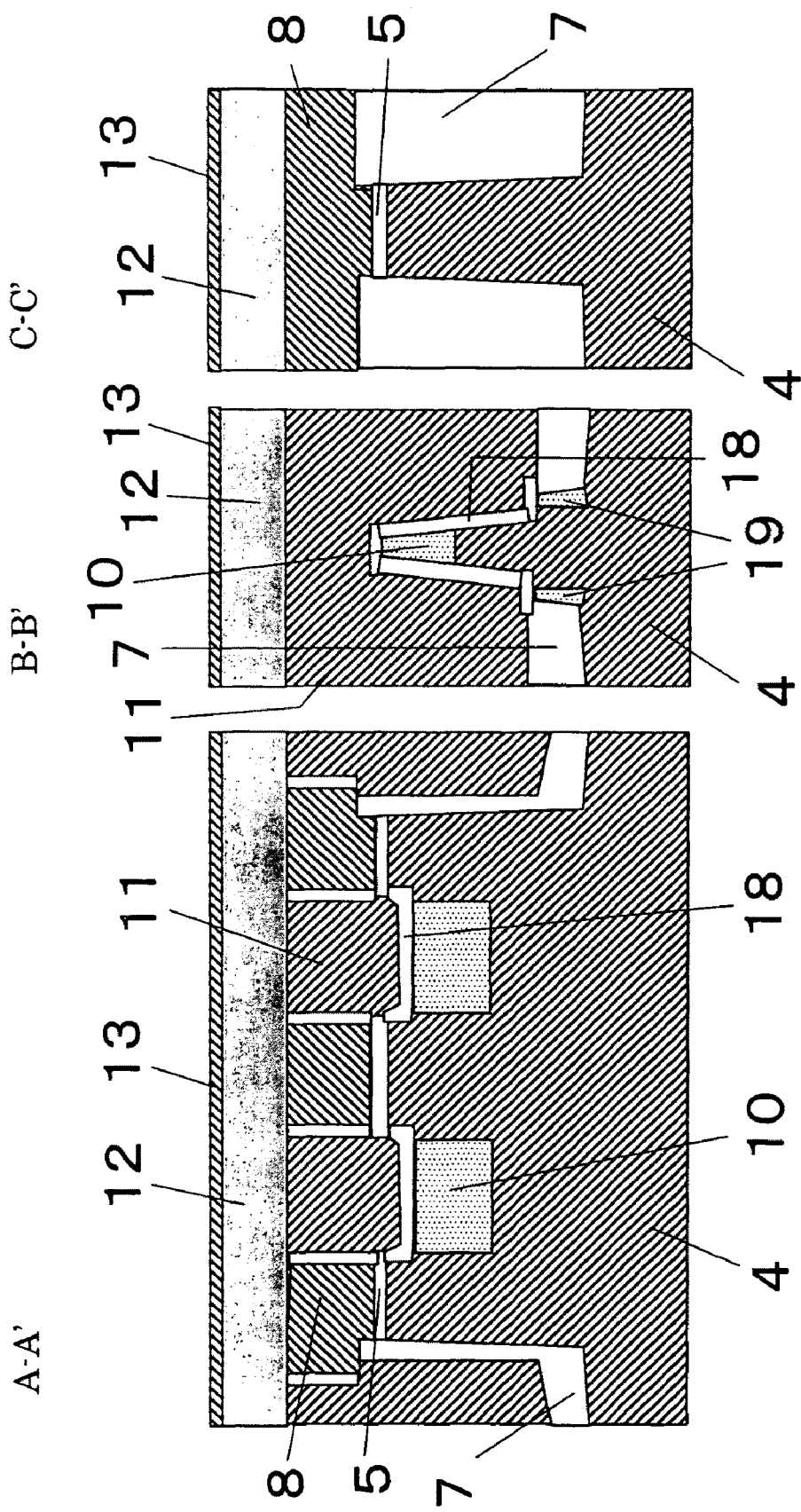

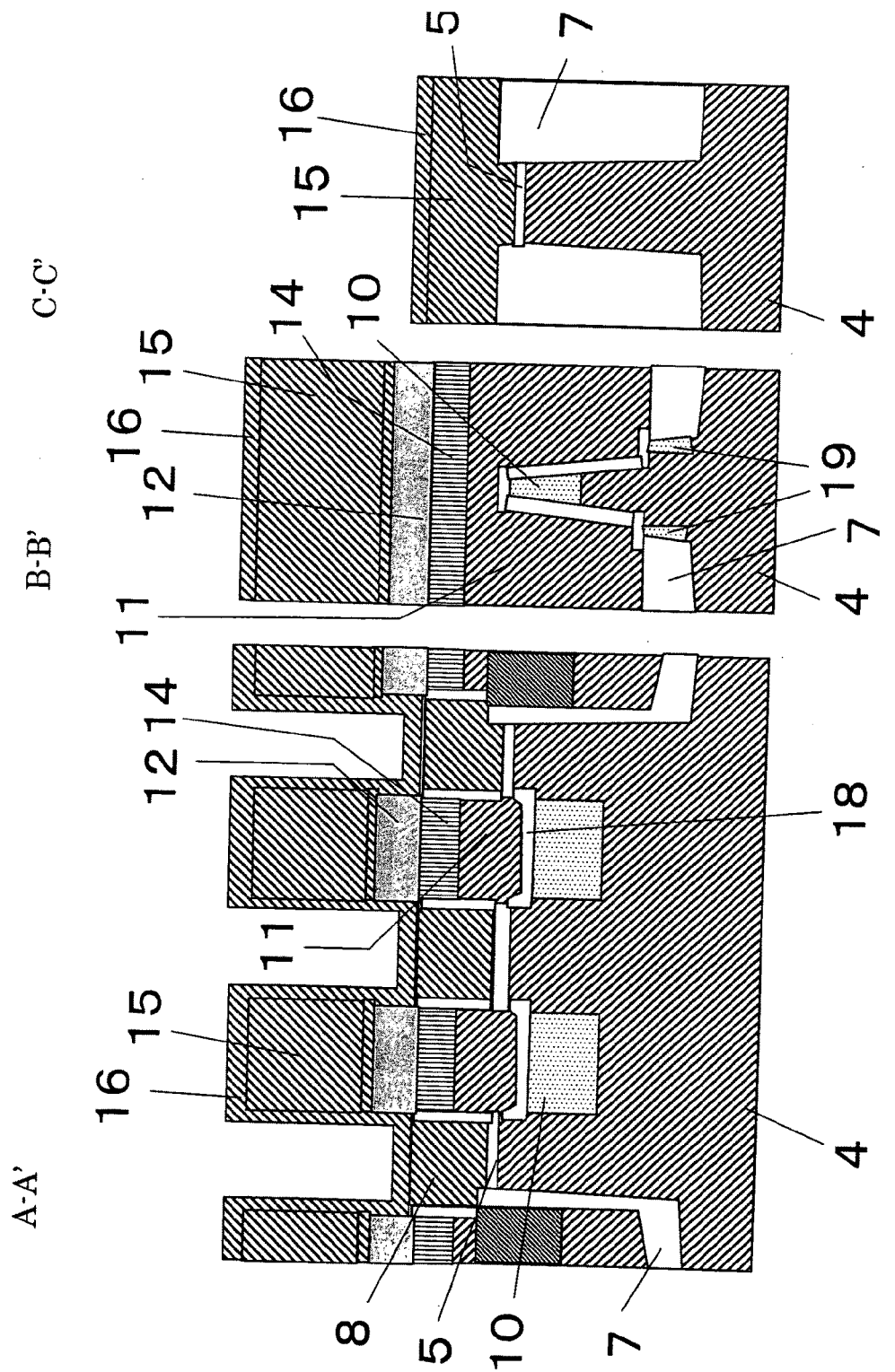

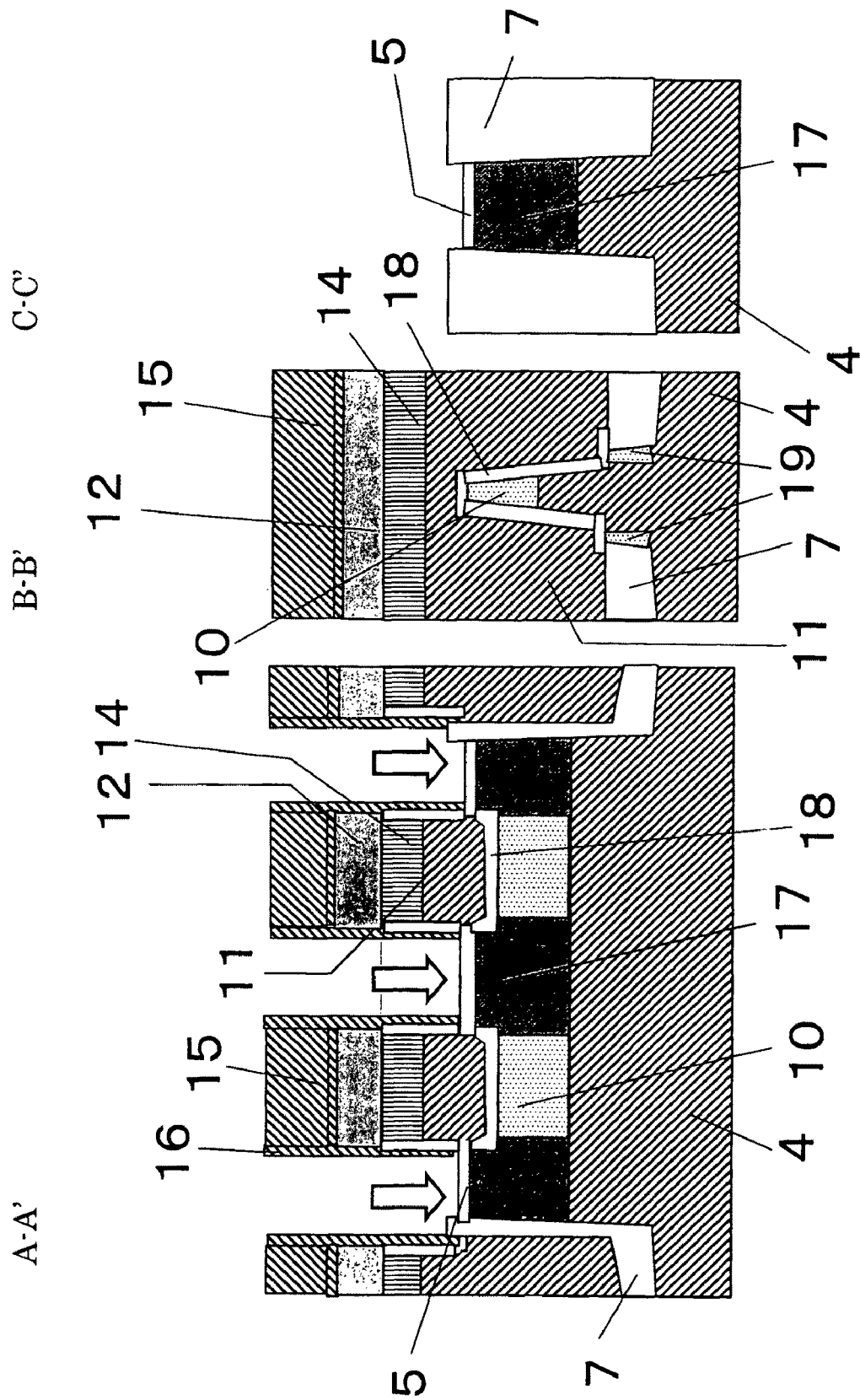

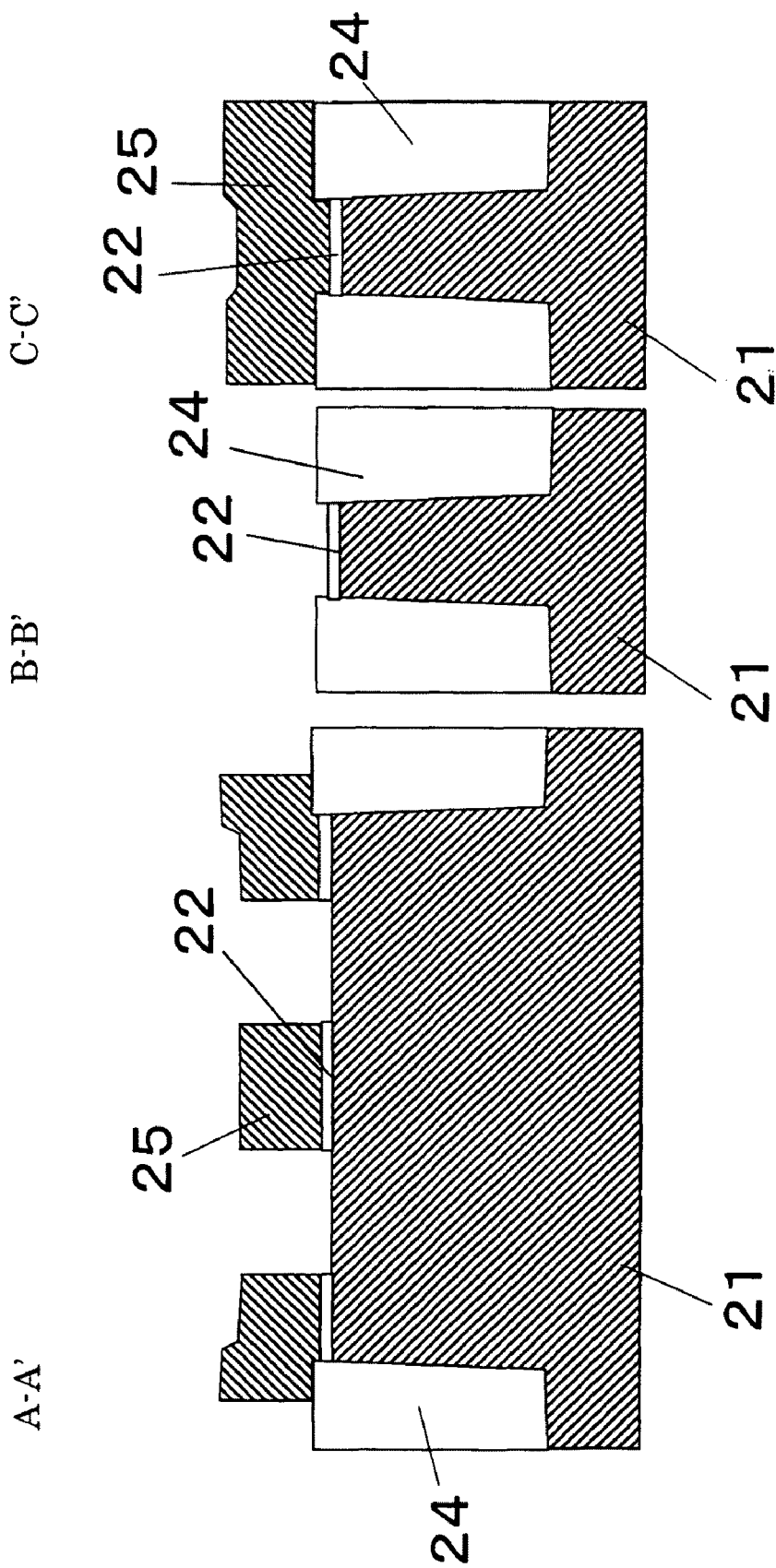

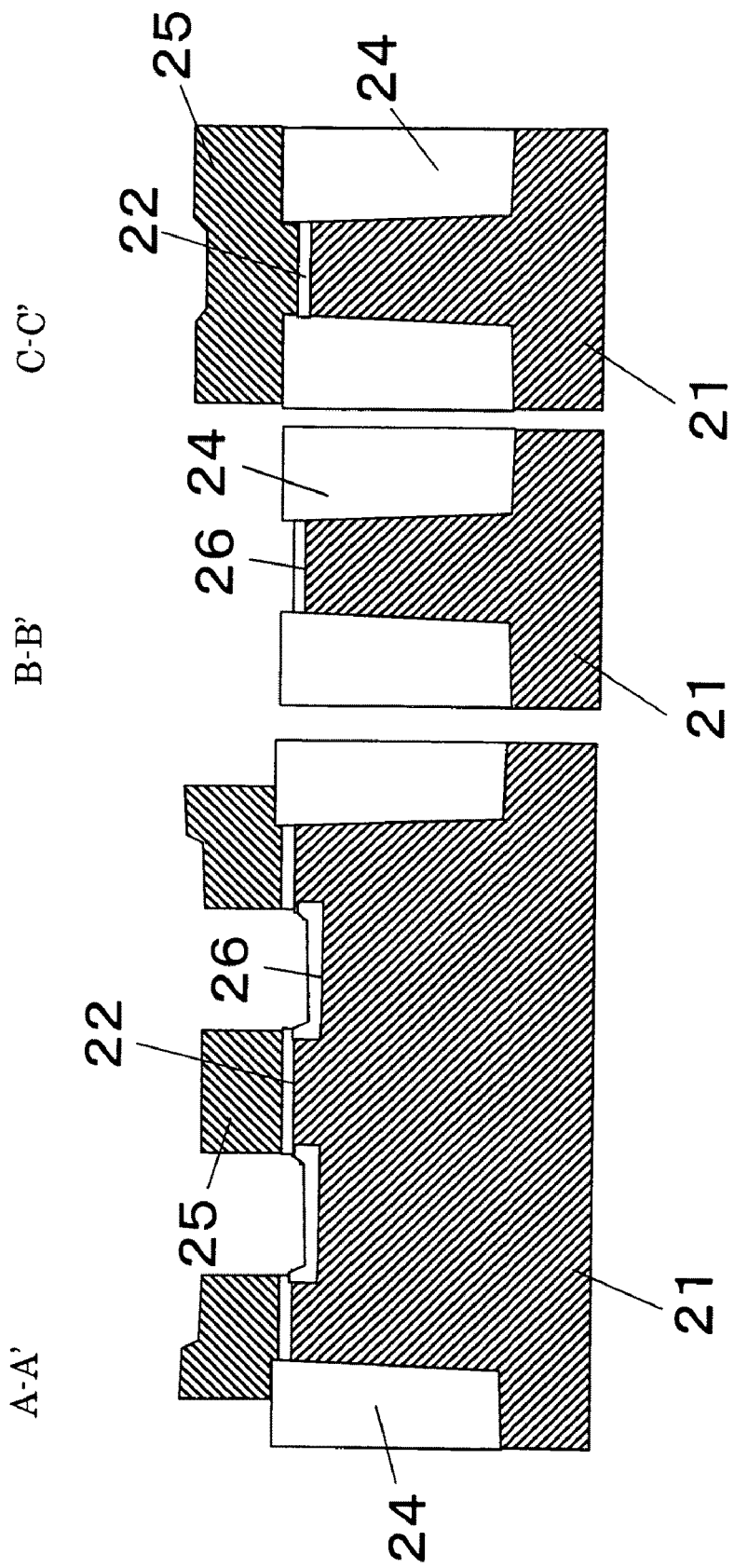

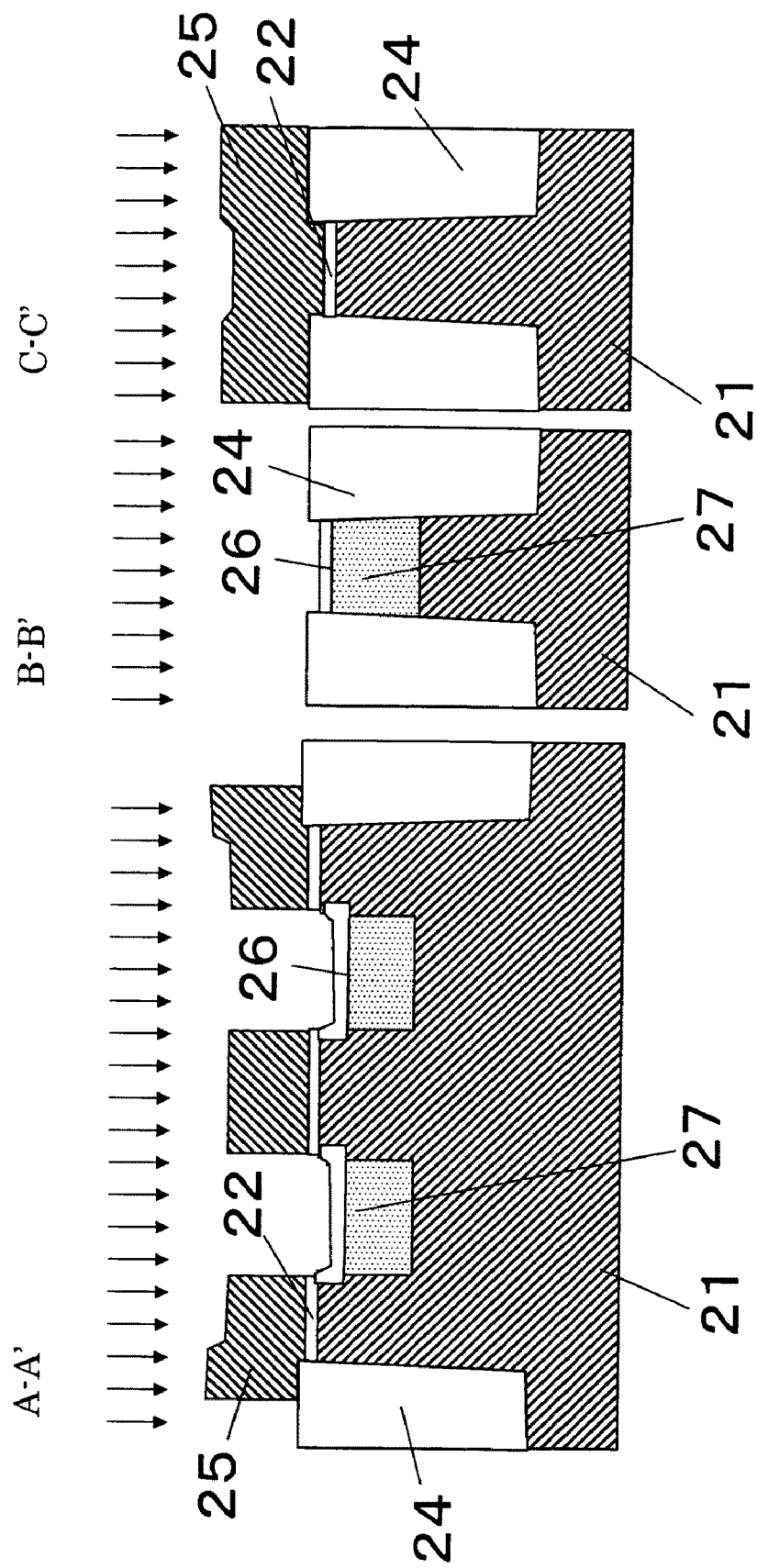

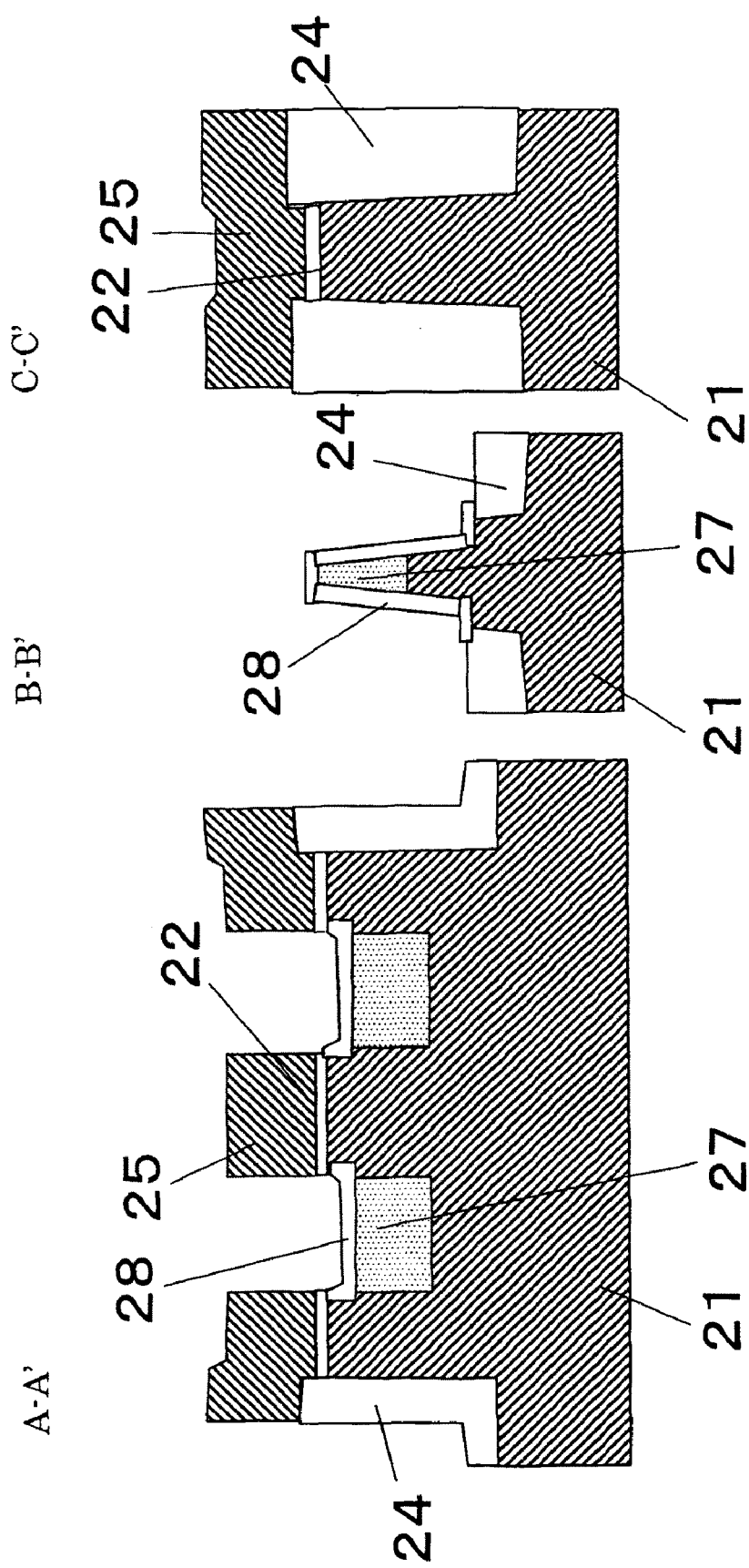

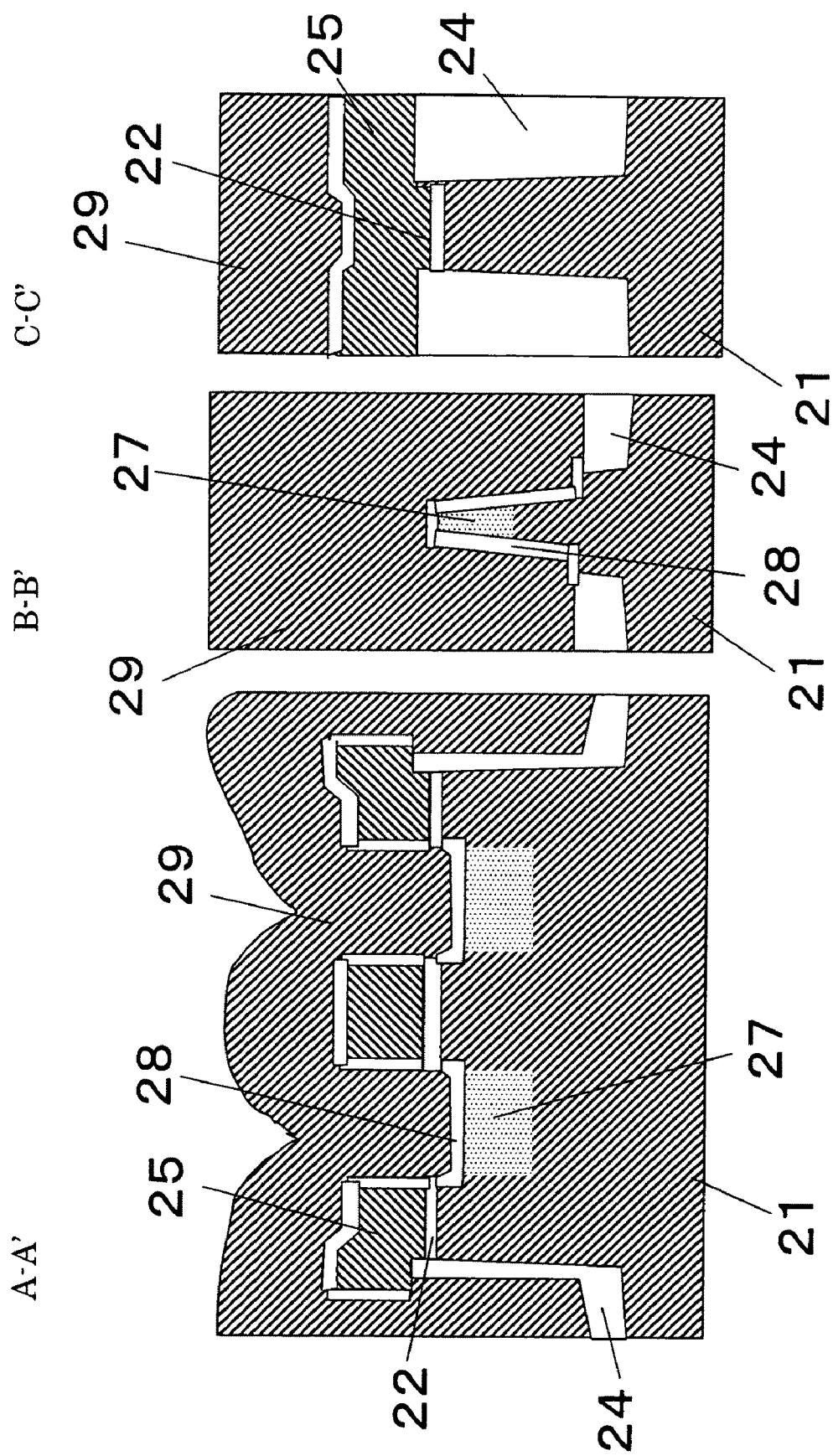

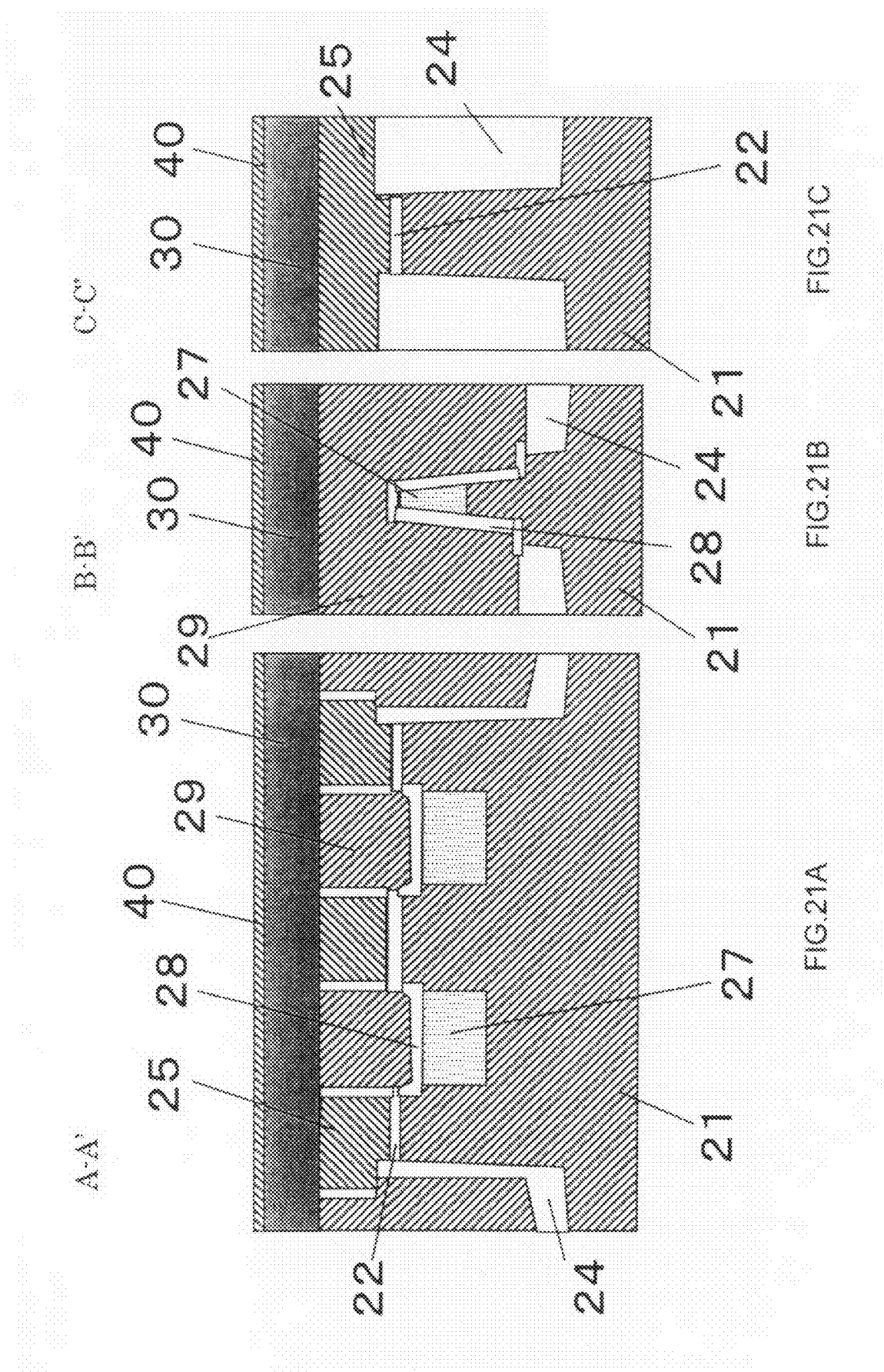

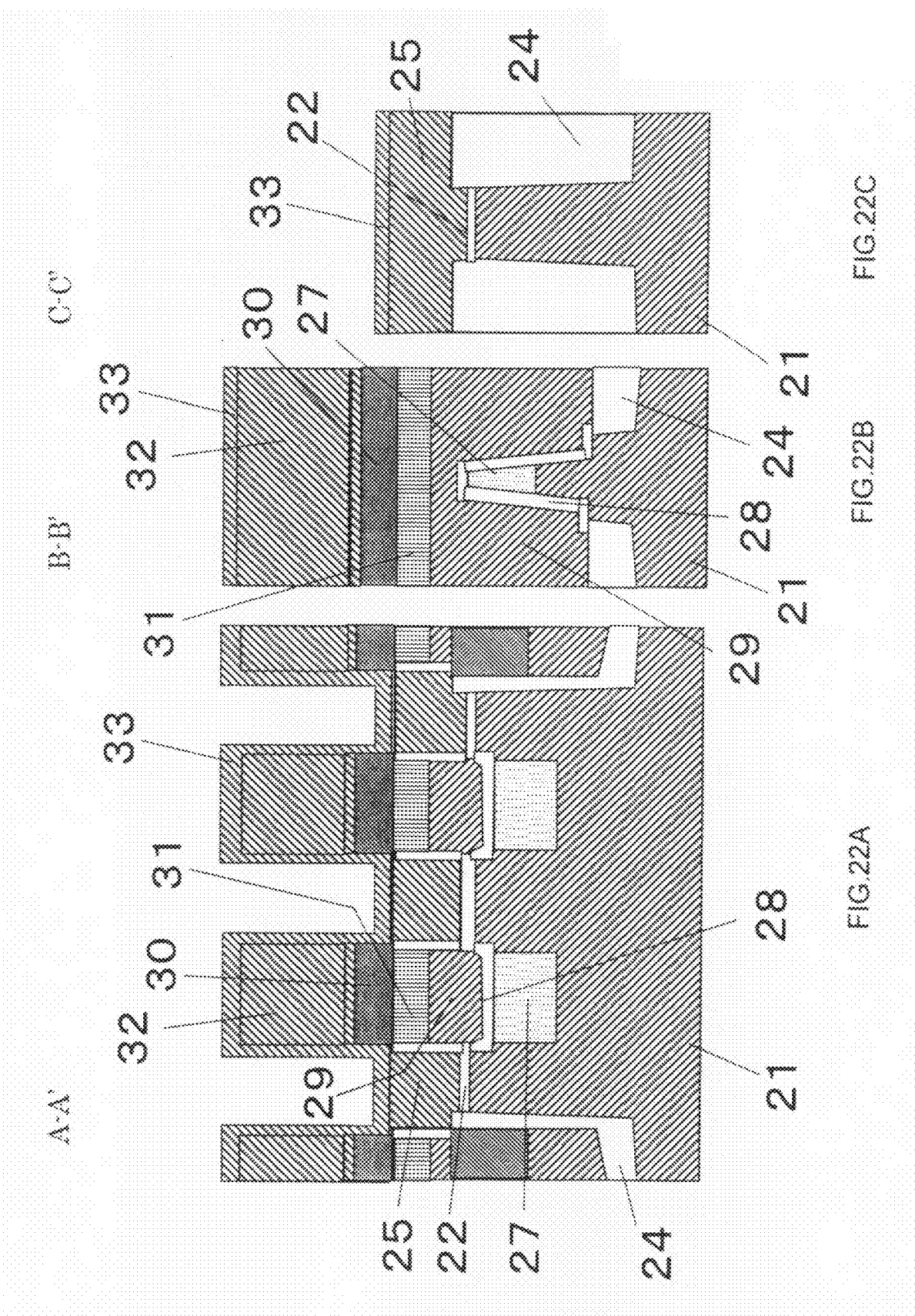

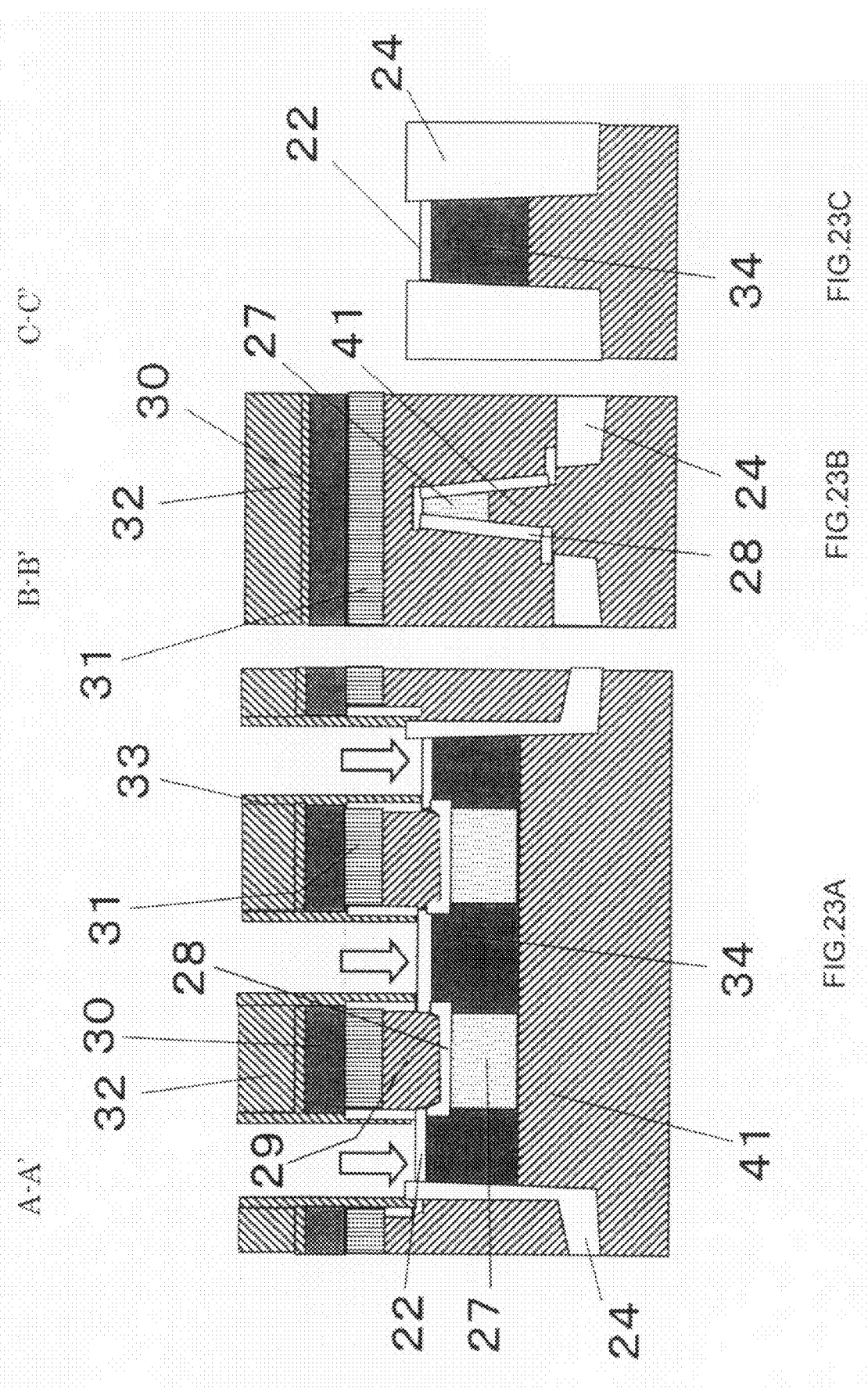

SEMICONDUCTOR DEVICE AND METHOD FOR MANUFACTURING THE SAME

This application is based upon and claims the benefit of priority from Japanese Patent Application No. 2007-293343, filed on Nov. 12, 2007, the disclosure of which is incorporated herein in its entirety by reference.

BACKGROUND OF THE INVENTION

1. Field of the Invention

The present invention relates to a semiconductor device comprising a Fin field effect transistor, and a method for manufacturing a semiconductor device.

2. Description of the Related Art

Much attention has been paid to a Fin field effect transistor (hereinafter sometimes referred to as a "FinFET") as a transistor offering a larger ON current and a smaller OFF current than a planar transistor. In the FinFET, a gate electrode is formed to stride across a projecting semiconductor region. A gate insulating film is formed between the gate electrode and the projecting semiconductor region. A part of the projecting semiconductor region which is located immediately below the gate electrode forms a channel region. A part of the projecting semiconductor region which is not covered with the gate electrode forms a source/drain region.

Two types of FinFET are available: a single-structure FinFET with one gate electrode and one source/drain region, and a multi-structure FinFET with a plurality of gate electrodes and a plurality of source/drain regions. Japanese Patent Laid-Open No. 64-8670 discloses a single-structure FinFET. Japanese Patent Laid-Open Nos. 2002-118255 and 2001-298194 disclose multi-structure FinFETs.

FIG. 1 illustrates a top view of a semiconductor device including a multi-structure FinFET with two gate electrodes. As illustrated in FIG. 1, the FinFET includes projecting semiconductor region 1 on a substrate. Two gate electrodes 2 are provided so as to stride across semiconductor region 1. A gate insulating film (not illustrated in the drawings) is provided between semiconductor region 1 and each gate electrode 2. Both parts of semiconductor region 1 sandwiching each gate electrode 2 form source/drain region 3. Semiconductor region 1, one gate electrode 2, the gate insulating film, and source/drain region 3, that is, a set of a source region and a drain region, form one FinFET. In FIG. 1, the source/drain region is shared by adjacent FinFETs.

FIGS. 2 to 12 are diagrams illustrating a process for manufacturing a semiconductor device including the FinFET. A in each of the figures denotes a cross section A-A' of the FinFET in FIG. 1. B in each of the figures denotes a cross section B-B' of the FinFET in FIG. 1. C in each of the figures denotes a cross section C-C' of the FinFET in FIG. 1.

First, silicon semiconductor substrate 4 is prepared. A surface of silicon semiconductor substrate 4 is oxidized to form silicon oxide film 5. Then, a silicon nitride film is formed all over the resulting surface and then patterned by a lithography technique. The silicon nitride film is thereafter dry etched to form pattern 6 of the silicon nitride film. This step covers the silicon semiconductor region (active region) with pattern 6 of the silicon nitride film and forms a shape in which a part of silicon semiconductor substrate 4 corresponding to an isolation region is exposed (FIG. 2).

Then, pattern 6 of the silicon nitride film is used as a hard mask to dry etch silicon oxide film 5 and silicon semiconductor substrate 4. The dry etched part of silicon semiconductor substrate 4 is thereafter oxidized to grow a silicon oxide film. The silicon oxide film is then subjected to a CMP process to form isolation region 7 (FIG. 3).

Then, pattern 6 of the silicon nitride film is removed. Thereafter, a silicon nitride film is newly formed on a part of silicon semiconductor substrate 4 on which isolation region 7 has not been formed. The silicon nitride film is then patterned by the lithography technique. The silicon nitride film is thereafter dry etched to form mask pattern 8 of the silicon nitride film. Silicon oxide film 5 is then removed by dry etching using mask pattern 8 of the silicon nitride film as a mask. At this time, silicon semiconductor substrate 4 is exposed (FIG. 4).

In this case, a surface of the exposed part of silicon semiconductor substrate 4 may be degraded by etching. Thus, sacrifice oxide layer 9 is formed on the exposed part of silicon semiconductor substrate 4 (FIG. 5).

Then, the sacrifice oxide layer is removed by wet etching to expose silicon semiconductor substrate 4 (FIG. 6). Impurities for a channel region are thereafter implanted into silicon semiconductor substrate 4 through mask pattern 8 of the silicon nitride film as a mask to form impurity region 10 (FIG. 7). Thermal oxidation based on ISSG (In Situ Stream Generation) is thereafter performed to form an oxide film all over the resulting surface. Gate insulating film 18 is thus formed on exposed silicon semiconductor substrate 4.

DOPOS (DOped POlycrystalline Silicon) is thereafter grown to form polysilicon film 11 all over the resulting surface (FIG. 9). Polysilicon film 11 is then subjected to a CMP (Chemical Mechanical Polishing) process using mask pattern 8 of the silicon nitride film as a stopper.

Then, W (tungsten) film 12 and silicon nitride film 13 are deposited all over the resulting surface (FIG. 10). A part of polysilicon film 11 and a part of W film 12 are allowed to react with each other (silicidized) to form WSi film 14 on polysilicon film 11, on which W film 12 is left. Thus, a gate electrode made up of a laminate structure of the W layer, WSi layer, and polysilicon layer is formed.

Then, the first mask 15 is formed on the gate electrode. A process of forming the first mask 15 involves, for example, depositing a silicon nitride film all over the resulting surface, and then patterning the silicon nitride film using the lithography technique so as to leave the silicon nitride film only on the gate electrode to form the first mask 15.

Then, W film 12 on the mask pattern is removed through the first mask 15 as a mask. Protect film 16 is formed all over the resulting surface (FIG. 11). The resulting surface is then entirely etched back to remove mask pattern 8 and protective film 16 on mask pattern 8 so as to leave the first mask 15 on the gate electrode. Impurities are then implanted into silicon semiconductor substrate 4 through the first mask 15 as a mask to form source/drain region 17 (FIG. 12).

We have now discovered that with the above-described method for manufacturing a semiconductor device, the width of the projecting semiconductor region, composed of the part of the semiconductor substrate surrounded by the isolation region, is reduced by formation and subsequent removal of the sacrifice oxide film on exposed silicon semiconductor substrate 4. Furthermore, implantation of the impurities for the channel region is thereafter performed. Thus, for example, as shown in FIG. 7, the impurities for the channel region are implanted not only in the projecting semiconductor region but also even around lower part 19 of the projecting semiconductor region.

Since the impurities are implanted even around lower part 19 of the projecting semiconductor region, various problems have occurred in connection with the characteristics of the Fin field effect transistor. That is, when N-type impurities are implanted into an N-type Fin field effect transistor as shown in FIG. 7, a possible off current (leakage current) from lower part 19 of the projecting semiconductor region increases. Furthermore, when P-type impurities are implanted into the N-type Fin field effect transistor as shown in FIG. 7, an electric field gradient between the channel region and the drain region increases and thus a possible junction leakage current increase.

Moreover, when the P-type impurities are implanted into a P-type Fin field effect transistor as shown in FIG. 7, the possible off current (leakage current) from lower part 19 of the projecting semiconductor region increases. Furthermore, when the N-type impurities are implanted into the P-type Fin field effect transistor as shown in FIG. 7, the electric field gradient between the channel region increases and the drain region and thus the possible junction leakage current increase.

Furthermore, since the impurities are implanted even around lower part 19 of the projecting semiconductor region, the amount of impurities implanted in a part serving as the channel region correspondingly decreases while the field effect transistor is on, by the amount of impurities implanted in the lower part. As a result, strict control such as an advance increase in the amount of implanted impurities is conventionally required to implant a desired amount of impurities in the part serving as the channel region.

SUMMARY OF THE INVENTION

The present invention seeks to solve one or more of the above problems, or to improve upon those problems at least in part.

In one embodiment, there is provided a method for manufacturing a semiconductor device comprising a Fin field effect transistor, the method comprising:

(1) preparing a semiconductor substrate;
(2) forming an oxide film on a surface of the semiconductor substrate;
(3) forming an isolation region in the semiconductor substrate;
(4) forming a mask pattern on the entire semiconductor substrate expect for the isolation region;
(5) etching the oxide film away through the mask pattern as a mask to expose the semiconductor substrate;
(6) forming a sacrifice oxide film on a part of the semiconductor substrate exposed in (5);
(7) implanting impurity into the semiconductor substrate through the mask pattern as a mask;
(8) removing the sacrifice oxide film to expose the semiconductor substrate;
(9) forming a gate insulating film on the exposed semiconductor substrate;
(10) forming a polysilicon film on the gate insulating film;
(11) performing a CMP process on the polysilicon film through the mask pattern as a stopper;
(12) forming a metal film on the polysilicon film;
(13) reacting at least a part of the metal film with at least a part of the polysilicon film to silicidize the metal to form a gate electrode;
(14) removing the mask pattern; and
(15) implanting impurity into the opposite sides of the semiconductor substrate across the gate electrode to form a source/drain region.

In another embodiment, there is provided a method for manufacturing a semiconductor device comprising a Fin field effect transistor, the method comprising:

(1) preparing a structure comprising a semiconductor substrate and an isolation region in the semiconductor substrate;
(2) forming a mask pattern on the entire semiconductor substrate expect for the isolation region;
(3) forming a sacrifice oxide film on an exposed part of the semiconductor substrate which is not covered by a mask constituting the mask pattern;
(4) implanting impurity into the semiconductor substrate through the mask pattern as a mask;
(5) removing the sacrifice oxide film to expose the semiconductor substrate;
(6) forming a gate insulating film on the exposed part of the semiconductor substrate;
(7) forming a polysilicon film on the gate insulating film;
(8) performing a CMP process on the polysilicon film through the mask pattern as a stopper;
(9) forming a metal film on the polysilicon film;
(10) reacting the metal film with the polysilicon film to silicidize the metal to form a gate electrode;
(11) removing the mask pattern; and
(12) implanting impurity into the opposite sides of the semiconductor substrate across the gate electrode to form a source/drain region.

In another embodiment, there is provided a method for manufacturing a semiconductor device comprising a Fin field effect transistor, the method comprising:

(1) preparing a projecting semiconductor region extending in a predetermined direction;
(2) forming a sacrifice oxide film on an intermediate portion of the semiconductor region in the predetermined direction;
(3) implanting impurity into a part of the semiconductor region under the sacrifice oxide film;
(4) removing the sacrifice oxide film to expose the semiconductor region;
(5) forming a gate insulating film on the exposed part of the semiconductor region;
(6) forming a polysilicon film and a metal film in order on the gate insulating film;
(7) reacting the metal film with the polysilicon film to silicidize the metal to form a gate electrode; and
(8) implanting impurity into the opposite sides of the semiconductor region across the gate electrode in the predetermined direction to form a source/drain region.

In the above embodiments, impurities can be implanted in only a part of the field effect transistor which serves as a channel region while the field effect transistor is on. The above embodiments can thus reduce a possible off current (leakage current) and also reduce the electric field gradient between the channel region and a drain region to reduce a possible junction leakage current. As a result. The above embodiments can provide a semiconductor device including a Fin field effect transistor offering excellent operational characteristics. The above embodiments also facilitate control of the amount of implanted impurities and the concentration of impurities in the channel region.

BRIEF DESCRIPTION OF THE DRAWINGS

The above features and advantages of the present invention will be more apparent from the following description of certain preferred embodiments taken in conjunction with the accompanying drawings, in which:

FIG. 2 (consisting of FIGS. 2A, 2B and 2C) is a diagram illustrating the method for manufacturing the related semiconductor device;

FIG. 3 (consisting of FIGS. 3A, 3B and 3C) is a diagram illustrating the method for manufacturing the related semiconductor device;

FIG. 4 (consisting of FIGS. 4A, 4B and 4C) is a diagram illustrating the method for manufacturing the related semiconductor device;

FIG. 5 (consisting of FIGS. 5A, 5B and 5C) is a diagram illustrating the method for manufacturing the related semiconductor device;

FIG. 6 (consisting of FIGS. 6A, 6B and 6C) is a diagram illustrating the method for manufacturing the related semiconductor device;

FIG. 7 (consisting of FIGS. 7A, 7B and 7C) is a diagram illustrating the method for manufacturing the related semiconductor device;

FIG. 8 (consisting of FIGS. 8A, 8B and 8C) is a diagram illustrating the method for manufacturing the related semiconductor device;

FIG. 9 (consisting of FIGS. 9A, 9B and 9C) is a diagram illustrating the method for manufacturing the related semiconductor device;

FIG. 10 (consisting of FIGS. 10A, 10B and 10C) is a diagram illustrating the method for manufacturing the related semiconductor device;

FIG. 11 (consisting of FIGS. 11A, 11B and 11C) is a diagram illustrating the method for manufacturing the related semiconductor device;

FIG. 12 (consisting of FIGS. 12A, 12B and 12C) is a diagram illustrating the method for manufacturing the related semiconductor device;

FIG. 15 (consisting of FIGS. 15A, 15B and 15C) is a diagram illustrating the example of the method for manufacturing a semiconductor device according to the present invention;

FIG. 16 (consisting of FIGS. 16A, 16B and 16C) is a diagram illustrating the example of the method for manufacturing a semiconductor device according to the present invention;

FIG. 17 (consisting of FIGS. 17A, 17B and 17C) is a diagram illustrating the example of the method for manufacturing a semiconductor device according to the present invention;

FIG. 19 (consisting of FIGS. 19A, 19B and 19C) is a diagram illustrating the example of the method for manufacturing a semiconductor device according to the present invention;

FIG. 20 (consisting of FIGS. 20A, 20B and 20C) is a diagram illustrating the example of the method for manufacturing a semiconductor device according to the present invention;

FIG. 21 (consisting of FIGS. 21A, 21B and 21C) is a diagram illustrating the example of the method for manufacturing a semiconductor device according to the present invention;

FIG. 22 (consisting of FIGS. 22A, 22B and 22C) is a diagram illustrating the example of the method for manufacturing a semiconductor device according to the present invention; and FIG. 23 (consisting of FIGS. 23A, 23B and 23C) is a diagram illustrating the example of the method for manufacturing a semiconductor device according to the present invention.

Figure 1:
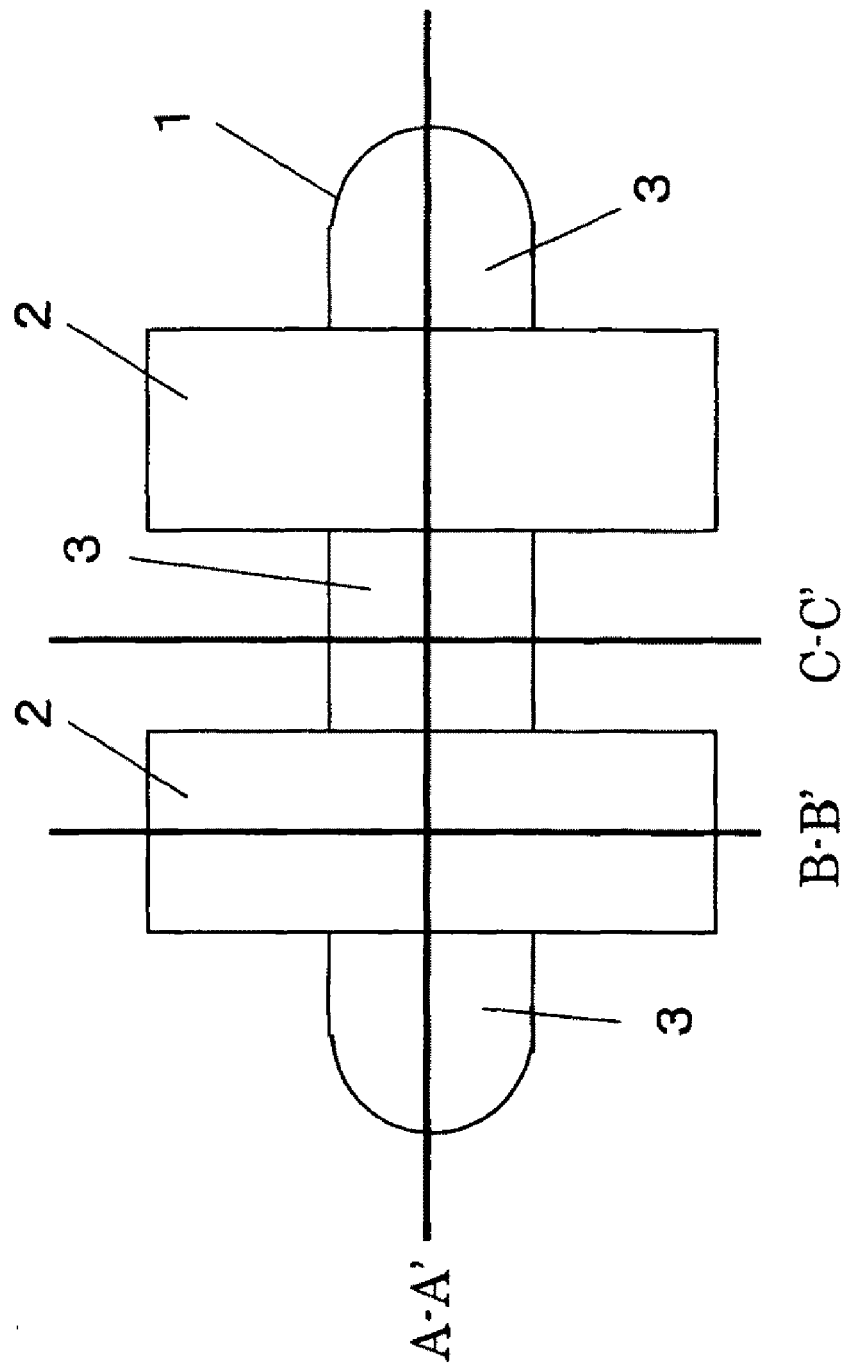
FIG. 1 is a diagram illustrating a method for manufacturing a related semiconductor device.

In the drawing, numerals have the following meanings. 1: projecting semiconductor region, 2: gate electrode, 3: source/drain region, 4: silicon semiconductor substrate, 5: silicon oxide film, 6: pattern of silicon nitride film, 7: isolation region, 8: mask pattern, 9: sacrifice oxide film, 10: impurity region for channel region, 11: polysilicon film, 12: W layer, 13: silicon nitride film, 14: WSi film, 15: First mask, 16: protect film, 17: source/drain region, 18: gate insulating film, 19: lower part of projecting semiconductor region, 21: silicon semiconductor substrate, 22: silicon oxide film, 23: pattern of silicon nitride film, 24: isolation region, 25: mask pattern, 26: sacrifice oxide film, 27: impurity region for channel region, 28: gate insulating film, 29: polysilicon film, 30: W layer, 31: WSi layer, 32: First mask, 33: protect film, 34: source/drain region, 40: silicon nitride film, 41: projecting semiconductor region

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In an example of the method for manufacturing a semiconductor device according to the present invention, first, a semiconductor substrate is prepared. Examples of the semiconductor substrate include a silicon semiconductor substrate and an SOI.

Then, an oxide film is formed on a surface of the semiconductor substrate. The oxide film may be formed by a method of, for example, if a surface of the semiconductor substrate is made up of silicon, forming a silicon oxide film by thermal oxidation.

Thereafter, an isolation region is formed in the semiconductor substrate. A method of forming the isolation region is not particularly limited but may be LOCOS (Local Oxidation of Silicon), STI (Shallow Trench Isolation), or the like. The STI is preferably used as a method that enables a reduction in the width of the isolation region and maximization of the depth of the isolation region.

Then, a mask pattern is formed on the entire resulting surface except for the area in which the isolation region is formed. In this case, a method may be used which, for example, deposits a silicon nitride film by a CVD method and then patterns the silicon nitride film by a lithography technique to form a mask pattern.

Then, the oxide film is etched away through the mask pattern as a mask to expose the semiconductor substrate. The part of the semiconductor substrate exposed in this step functions as a channel region of a FinFET.

Then, a sacrifice oxide film is formed in the part of the semiconductor substrate exposed in a precedent step. The reason why the sacrifice oxide film is formed in this step is that when the oxide film is etched in the precedent step, a surface of the semiconductor device may be degraded, so that the surface of the semiconductor substrate is removed as a sacrifice oxide film to make the characteristics of the semiconductor substrate uniform.

Then, impurities are implanted into the semiconductor substrate through the mask pattern as a mask. The type of the impurities and implantation conditions therefor can be appropriately set according to desired operational characteristics. B, P, As, or $BF_2$ is preferably used as the impurities; B is more preferably used. The implantation conditions for the impurities preferably include an acceleration voltage of 10 KeV and an implantation amount of $1 \times 10^{12}/cm^2$.

Then, the sacrifice oxide film is removed to expose the semiconductor substrate. In this step, the sacrifice oxide film can be removed by, for example, wet etching.

With the related manufacturing method, after formation and removal of the sacrifice oxide film, implantation of impurities for a channel region is performed. Thus, when the sacrifice oxide film is removed, the width of the projecting semiconductor region is reduced. Consequently, the impurities are implanted around lower part 19 of the projecting semiconductor region as shown in FIG. 7. This increases a possible off current (leakage current) from lower part 19 of the projecting semiconductor region or increases the electric field gradient between the channel region and the drain region, resulting in increasing a possible junction leakage current.

In contrast, according to the present embodiment, as shown in above steps, the impurities for the channel region are implanted in the projecting semiconductor region after the formation of the sacrifice oxide film and before the removal of the sacrifice oxide film. After the implantation of the impurities for the channel region, the sacrifice oxide film is removed. This prevents a situation in which before the implantation of the impurities for the channel region, the sacrifice oxide film is removed to expose the lower part of the projecting semiconductor region as shown in FIG. 7, so that the impurities are subsequently implanted around the exposed part. Thus, the impurities can be implanted exclusively in the projecting semiconductor region. The present embodiment can thus reduce the possible off current (leakage current) and also reduce the electric field gradient between the channel region and the drain region to reduce the possible junction leakage current. As a result, the present embodiment can provide a semiconductor device including a Fin field effect transistor offering excellent operational characteristics. The present embodiment also facilitates control of the amount of implanted impurities and the concentration of impurities in the channel region.

Then, a gate insulating film is formed on the semiconductor substrate exposed in a precedent step. In this step, for example, the gate insulating film can be formed by thermally oxidizing the surface of the semiconductor substrate or carrying out a deposition method such as CVD using a material gas having a predetermined composition.

The gate insulating film may be, for example, a silicon oxide film ($SiO_2$), a silicon nitride film ($Si_3N_4$), a laminate thereof, or an oxide film containing Hafnium (Hf. Alternatively, the gate insulating film may be, for example, a metal oxide, a metal silicate, or a high dielectric insulating film composed of the metal oxide or metal silicate into which nitrogen is doped.

The "high dielectric insulating film" refers to an insulating film having a higher dielectric constant than $SiO_2$, commonly utilized as a gate insulating film for the semiconductor device (the dielectric constant of $SiO_2$ is about 3.6). Typically, the dielectric constant of the high dielectric insulating film may be several tens to several thousands. The high dielectric insulating film may be, for example, HfSiO, HfSiON, HfZrSiO, HfZrSiON, ZrSiO, ZrSiON, HfAlO, HfAlON, HfZrAlO, HfZrAlON, ZrAlO, or ZrAlON.

Then, a conductive polysilicon film containing impurities is formed all over the resulting surface. This step may be a method of depositing polysilicon by CVD or the like and then ion-implanting impurities into the polysilicon, DOPOS (DOped POlycrystalline Silicon), or the like.

Then, the polysilicon film is subjected to a CMP process through the mask pattern as a stopper. The reason why the CMP (Chemical Mechanical Polishing) process is carried out in this step is that a surface of the polysilicon film deposited in a precedent step includes protrusions and recesses so as to reflect protrusions and recesses on the semiconductor substrate and mask pattern with the polysilicon film deposited thereon, so that deposition and silicidization of the metal film on the polysilicon film makes the control of the silicidization and the shaping of the gate electrode difficult. In this step, the previously provided mask pattern serves as a stopper for the CMP process. Thus, the surface of the polysilicon film can be accurately flattened.

Then, a metal film is formed all over the resulting surface. Here, in the present embodiment, since the surface of the polysilicon film is accurately flattened in the preceding step, the metal film can be uniformly deposited on the polysilicon film. As a result, even when silicidization reaction is allowed to occur between the metal and the polysilicon film during the succeeding step, a gate electrode with a uniform shape and uniform characteristics can be stably formed. The present embodiment can also prevent the possible peel-off of the gate electrode and the excessive development of the silicidization into the gate insulating film in some areas, which may impair the insulating property of the gate insulating film. The present embodiment can thus provide a semiconductor device including a FinFET with stable, uniform characteristics.

A method of depositing the metal film may be, for example, CVD. The type of the metal is not particularly limited provided that the metal reacts with silicon to enable silicidization. The metal may be, for example, Ni, Cr, Ir, Rh, Ti, Zr, Hf, V, Ta, Nb, Mo, or W. W (tungsten) film is preferably used as the metal film. Thus depositing a W film as the metal film enables the resistivity of the gate electrode to be set to a uniform, small value.

Then, at least a part of the metal film is reacted with at least a part of the polysilicon film to silicidize the metal, resulting in forming a gate electrode. In the step, all of the metal film may be reacted with all of the polysilicon film to silicidize the metal to form a gate electrode composed of silicide. Alternatively, a part (lower part) of the metal film may be react with all of the polysilicon film to silicidize the metal to form a gate electrode composed of a laminate structure (metal)/(silicide) of the metal and silicide. Alternatively, all of the metal film may be react with a part (upper part) of the polysilicon film to silicidize the metal to form a gate electrode composed of a laminate structure (silicide)/(polysilicon film) of the metal and silicide. Alternatively, a part (lower part) of the metal film may be react with a part (upper part) of the polysilicon film to silicidize the metal to form a gate electrode composed of the metal, silicide, and polysilicon film. That is, there are the gate electrode composed of the silicide, the gate electrode composed of the laminate structure of the metal and silicide, the gate electrode composed of the laminate structure of the silicide and polysilicon layer, or the gate electrode composed of the laminate structure of the metal, silicide, and polysilicon layer formed. What types of the gate electrode is formed depends on the ratio of the film thickness of the metal film to the film thickness of the polysilicon and silicidization conditions (such as temperature).

Preferably, in forming the metal film, the metal film is a W film, and in forming the gate electrode, a part of the polysilicon film is react with a part of the W film to silicidize the W to form a gate electrode of a laminate structure of the W layer, WSi layer, and polysilicon layer laminated in this order from above. Thus forming the laminate structure of the W layer, WSi layer, and polysilicon layer allows a low-resistance, uniform gate electrode to be formed even after miniaturization.

In forming the gate electrode, what silicide is formed depends on the type of the metal and the silicidization conditions. Specifically, the silicide may be, for example, NiSi, $Ni_2Si$, $Ni_3Si$, $NiSi_2$, $WSi_2$, WSi, $TiSi_2$, $VSi_2$, $CrSi_2$, $ZrSi_2$, $NbSi_2$, $MoSi_2$, $TaSi_2$, CoSi, $CoSi_2$, PtSi, $Pt_2Si$, or $Pd_2Si$. When at least a part of the gate electrode is thus composed of the silicide, the gate electrode can offer a low resistivity and an excellent conductivity.

Then, the first mask is formed on the gate electrode. The first mask can be formed by, for example, depositing a material for the first mask all over a surface of the gate electrode by CVD method or the like, and then using the lithography technique to leave the material for the first mask only on the gate electrode. The material for the first mask may be a silicon nitride film.

Then, the metal film is removed through the first mask as a mask. In step, the metal film is removed which is present on the mask pattern but which is not involved in the silicidization reaction.

Then, the mask pattern is removed. A method of removing the mask pattern preferably comprises:

after removing the metal film, forming a protect film all over the resulting surface; and etching back the entire resulting surface to remove the mask pattern and the protect film on the mask pattern so as to leave the first mask on the gate electrode.

The first mask may be formed to be thicker than the mask pattern or a material may be used which offers a higher resistance to etching. Then, as a result of the etch-back of the entire resulting surface, the first mask can be left on the gate electrode, and the mask pattern and the protect film on the mask pattern can be completely removed. In addition, the protect film has a function for protecting the gate electrode when impurities are implanted into the semiconductor substrate in the following step and may be a silicon nitride film.

Then, impurities are implanted into the semiconductor substrate through the first mask as a mask to form a source/drain region. To form a PMOS transistor as a FinFET, B or the like may be used as the impurities. Alternatively, to form an NMOS transistor as a FinFET, P, As, Sb, or the like may be used as the impurities. The concentration of impurity elements in the source-drain region is typically $1 \times 10^{19}$ to $1 \times 10^{21}$ $cm^{-3}$.

Furthermore, the manufacturing method according to the present embodiment may manufacture a semiconductor device including a plurality of the Fin field effect transistors by forming a plurality of gate electrodes in forming the gate electrode and forming a plurality of source/drain regions in forming the source/drain region.

Figures 13A, 13B, 13C:
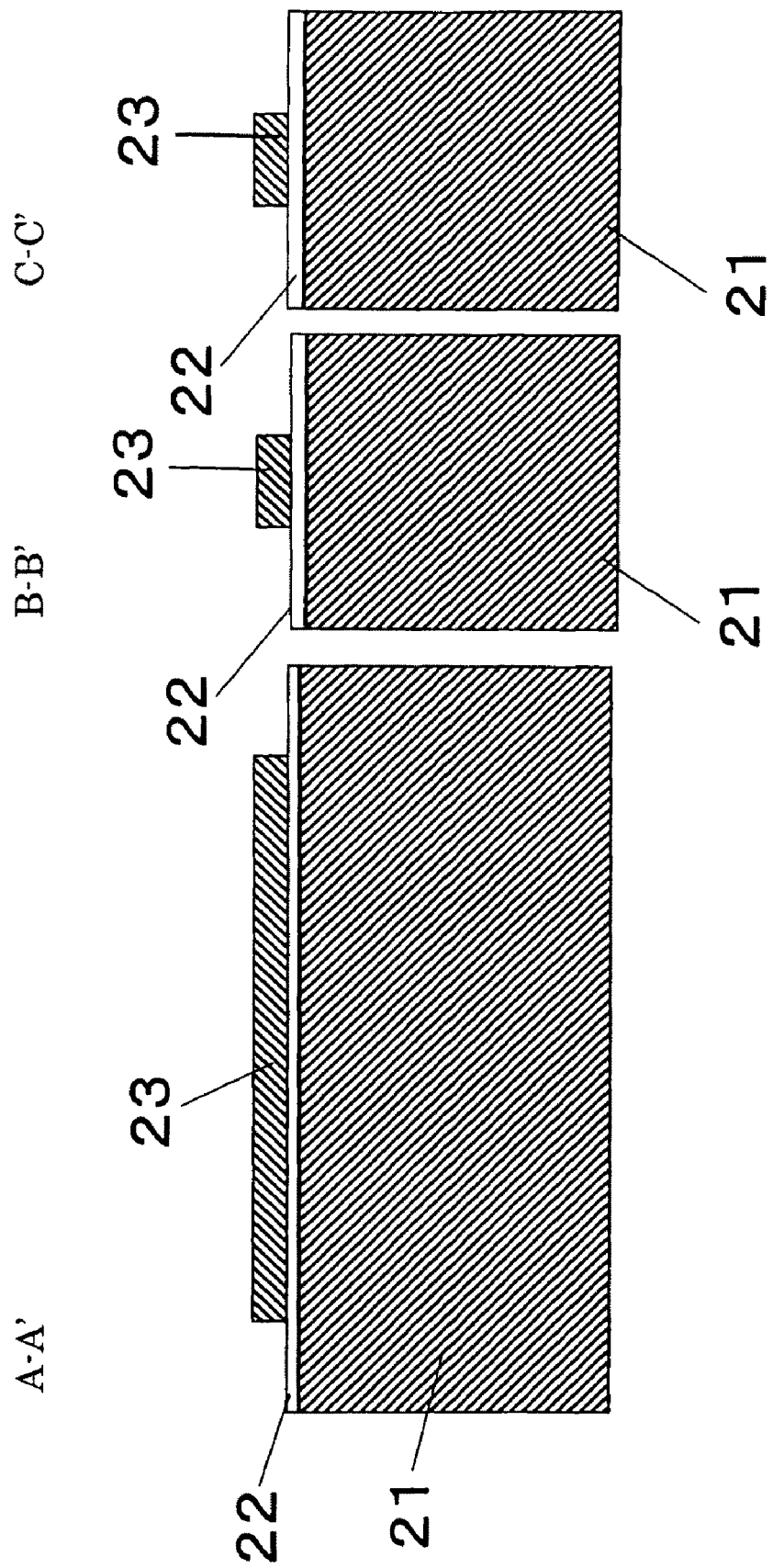
FIG. 13 (consisting of FIGS. 13A, 13B and 13C) is a diagram illustrating an example of a method for manufacturing a semiconductor device according to the present invention.

With the manufacturing method according to the present embodiment, the FinFET formed may be either of a P-type or of an N-type. To form the P-type FinFET, a source/drain region may be formed by implantation of P-type impurities in forming the source/drain region. To form the N-type FinFET, a source/drain region may be formed by implantation of N-type impurities in forming the source/drain region FIGS. 13 to 23 illustrate an example of the method for manufacturing a semiconductor device according to the present embodiment. A, B, and C of each of FIGS. 13 to 23 illustrate sectional views of cross sections of the semiconductor device corresponding to cross sections A-A', B-B', and C-C' in FIG. 24 explained hereinafter. First, silicon semiconductor substrate 21 is prepared. A surface of silicon semiconductor substrate 21 is oxidized to form silicon oxide film 22. Then, a silicon nitride film is formed on silicon oxide film 22. The silicon nitride film is then dry etched using the lithography technique to form pattern 23 of the silicon nitride film (FIG. 13).

Figures 14A, 14B, 14C:
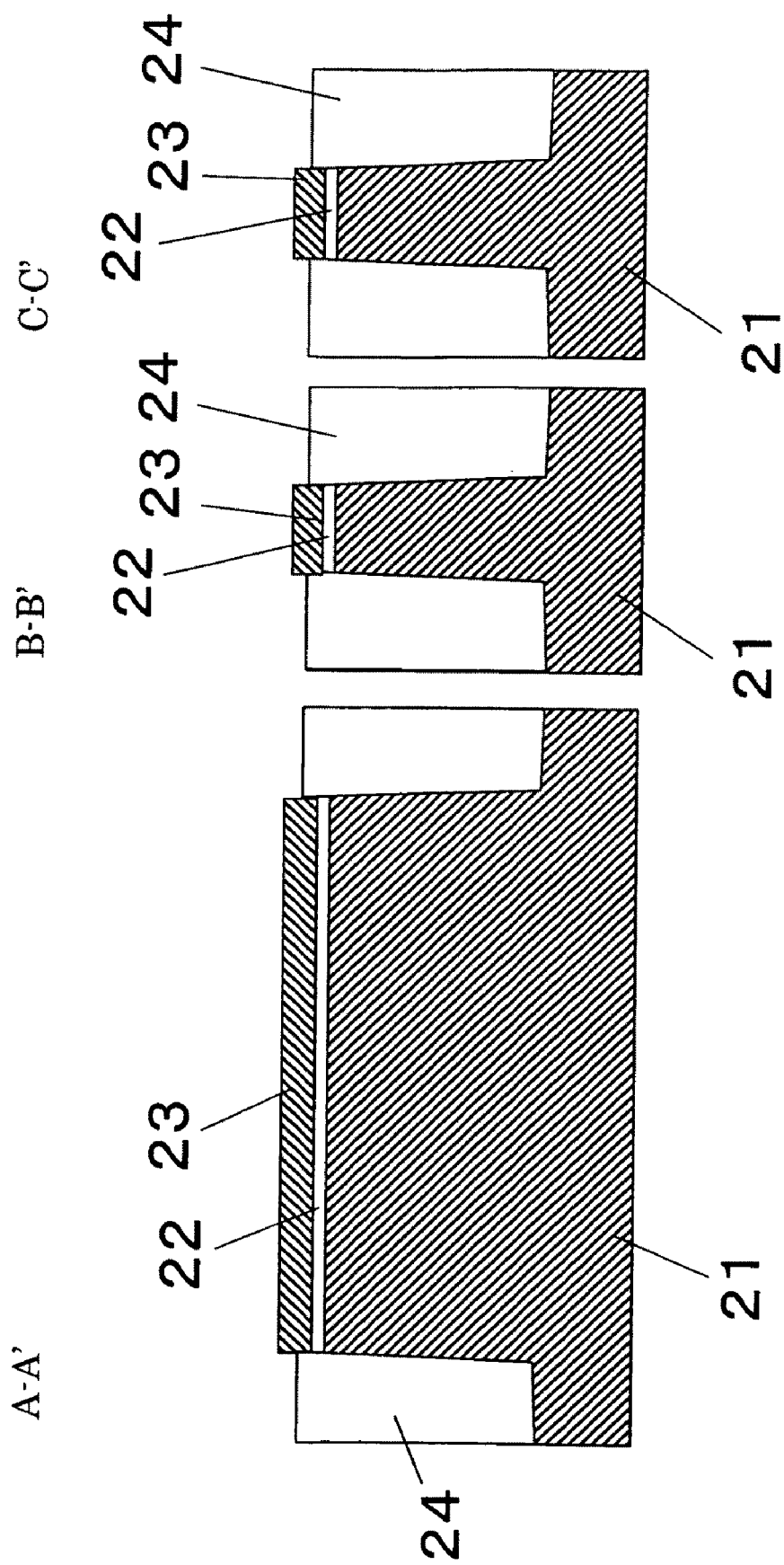
FIG. 14 (consisting of FIGS. 14A, 14B and 14C) is a diagram illustrating the example of the method for manufacturing a semiconductor device according to the present invention.

Then, isolation region 24 is formed in silicon semiconductor substrate 21 by an STI (Shallow Trench Isolation) technique (FIG. 14). That is, silicon oxide film 22 and silicon semiconductor substrate 21 are dry etched through pattern 23 of silicon nitride film as a hard mask. Thus, a shallow trench is formed in silicon semiconductor substrate 21. Thereafter, isolation region 24 can be formed by depositing a silicon oxide film all over the resulting surface and then flattening the resulting surface by the CMP process. At this time, a projecting semiconductor region is formed which is surrounded by isolation region 24.

Then, pattern 23 of the silicon nitride film is removed. Thereafter, a silicon nitride film is deposited all over the resulting surface. The silicon nitride film is then dry etched by the lithography technique to form mask pattern 25 of the silicon nitride film (FIG. 15). In this case, mask pattern 25 is formed in the entire surface of silicon semiconductor substrate 21 except for the part thereof in which isolation region 24 is formed.

Then, silicon oxide film 22 is removed by dry etching through mask pattern 25 as a mask. At this time, silicon semiconductor substrate 21 is exposed. In this case, the surface of the exposed part of silicon semiconductor substrate 21 may be degraded by etching. Thus, sacrifice oxide film 26 is formed on the exposed part of silicon semiconductor substrate 21 (FIG. 16).

Then, impurities are implanted into silicon semiconductor substrate 21 through mask pattern 25 as a mask. Impurity region 27 is thus formed which serves as a channel region while the field effect transistor is on (FIG. 17).

Figures 18A, 18B, 18C:
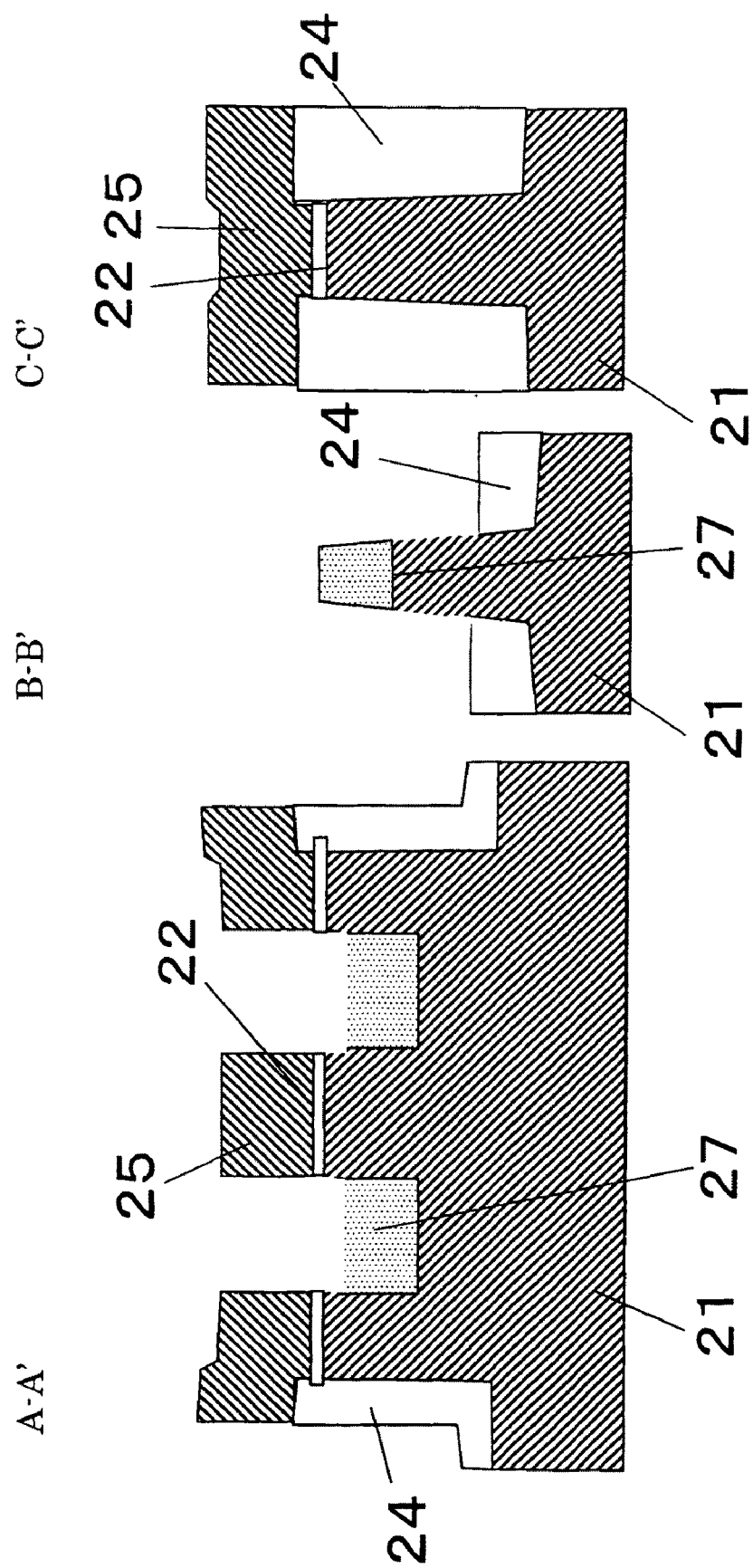
FIG. 18 (consisting of FIGS. 18A, 18B and 18C) is a diagram illustrating the example of the method for manufacturing a semiconductor device according to the present invention.

Then, sacrifice oxide film 26 is removed by wet etching to expose silicon semiconductor substrate 21 (FIG. 18). As described above, the manufacturing method according to the present embodiment implants the impurities for channel region in the projecting semiconductor region after the formation of the sacrifice oxide film and before the removal of the sacrifice oxide film. After implantation of the impurities for channel region, the sacrifice oxide film is removed. This prevents a situation in which the sacrifice oxide film is removed to expose the lower part of the projecting semiconductor region as shown in FIG. 7, so that the impurities are subsequently implanted around the exposed part on implantation of the impurities for channel region. Thus, the impurities can be implanted exclusively in the projecting semiconductor region. The present embodiment can thus reduce the possible off current (leakage current) and also reduce the electric field gradient between the channel region and the drain region to reduce the possible junction leakage current. As a result, the present embodiment can provide a semiconductor device including a Fin field effect transistor offering excellent operational characteristics. The present embodiment also facilitates control of the amount of implanted impurities and the concentration of impurities in the channel region.

Then, gate insulating film 28 is then formed on the exposed part of silicon semiconductor substrate 21 (FIG. 19). DOPOS (DOped POlycrystalline Silicon) is thereafter grown to form polysilicon film 29 all over the resulting surface (FIG. 20).

In this case, if metal film is deposited and silicidized directly on polysilicon film 29, the shape and characteristics of the gate electrode may be non-uniform. Thus, in the subsequent step, polysilicon film 29 is subjected to the CMP (Chemical Mechanical Polishing) process. At this time, mask pattern 25 of the silicon nitride film serves as a stopper for the CMP process. This allows accurate flattening. As a result, during the subsequent step, silicidization can be uniformly performed to make the shape and characteristics of the gate electrode uniform.

Then, W (tungsten) film 30 is deposited all over the resulting surface (FIG. 21). Thereafter, a part of W film 30 are reacted with a part of polysilicon film 29 (silicidized) to form WSi film 31 on polysilicon film 29. W film 30 is left on WSi film 31. Thus, a gate electrode made up of a laminate structure of the W layer, WSi layer, and polysilicon layer is formed.

Then, the first mask 32 is formed on the gate electrode (step (14)). The step of forming the first mask 32 may include, for example, depositing a silicon nitride film all over the resulting surface and patterning the silicon nitride film using the lithography technique so as to leave the silicon nitride film only on the gate electrode to obtain the first mask 32.

Then, W film 30 on mask pattern 25 is removed through the first mask 32 as a mask. Protect film 33 is thereafter formed all over the resulting surface (FIG. 22). The entire resulting surface is then etched back to remove mask pattern 25 and protect film 33 on mask pattern 25 so as to leave the first mask 32 on the gate electrode.

Then, impurities are implanted into silicon semiconductor substrate 21 through the first mask 32 as a mask to form source/drain region 34 (FIG. 23).

2. Semiconductor Device

The semiconductor device according to the present embodiment includes at least one FinFET. The FinFET includes a projecting semiconductor region. A gate electrode is formed to stride across the projecting semiconductor region. A gate insulating film is formed between the gate electrode and the projecting semiconductor region. A source/drain region is formed in a part of the projecting semiconductor region which is not covered with the gate electrode.

In the FinFET, by adjusting the thickness of the insulating film between the gate electrode and the projecting semiconductor region, a channel region can be formed exclusively on a side surface of the projecting semiconductor region or on both the side surface and a top surface of the projecting semiconductor region. That is, by thickening the insulating film between the gate electrode and the top surface of the projecting semiconductor region, a double gate FinFET can be formed in which the channel region is formed only on the side surface of the projecting semiconductor region. By thinning the insulating film between the gate electrode and both the top and side surfaces of the projecting semiconductor region, a trigate FinFET can be formed in which the channel region is formed on both the side and top surfaces of the projecting semiconductor region.

The semiconductor device according to the present embodiment may include either a single-structure FinFET with one gate electrode or a multi-structure FinFET with a plurality of gate electrodes.

In the semiconductor device according to the present embodiment, the impurities are present only in the region that serves as the channel region while the Fin field effect transistor is on. Thus, the concentration of the impurities in the channel region can be easily controlled to the desired value. The semiconductor device can also exhibit excellent, stable operational characteristics.

Figure 24:
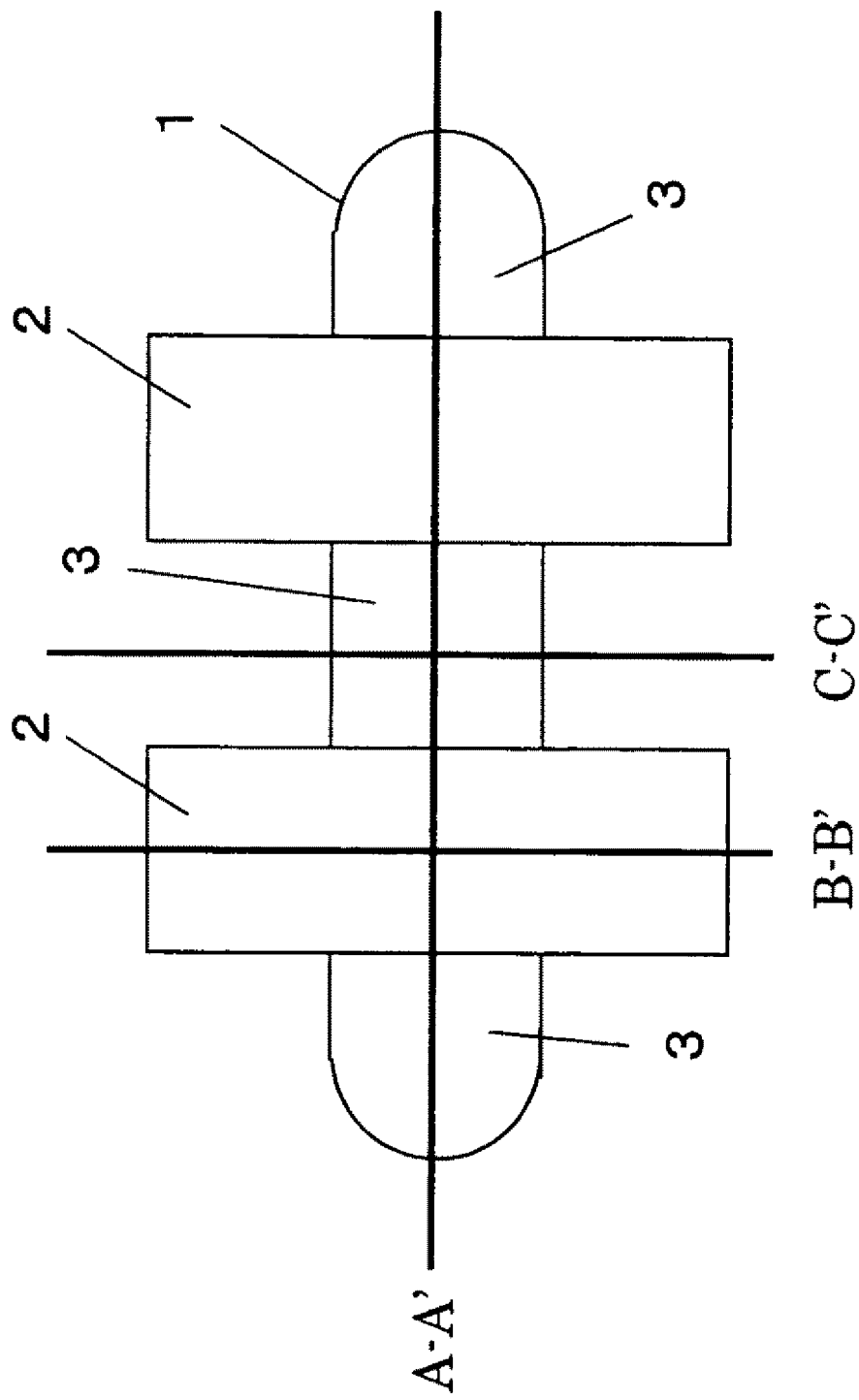
FIG. 24 is a diagram illustrating an example of semiconductor device of the present invention.

FIGS. 23 and 24 illustrate an example of the FinFET according to the present embodiment. FIGS. 24 illustrates a top view of the example of the FinFET. FIGS. 23A, 23B, and 23C illustrate sectional views of cross sections of the FinFET corresponding to cross sections A-A', B-B', and C-C' in FIG. 24.

The semiconductor device in FIG. 23 includes projecting semiconductor region 41 on a semiconductor substrate. A gate electrode is formed so as to stride across semiconductor region 41. The gate electrode is composed of a laminate structure of W layer 29, WSi layer 31, and polysilicon layer 30. Gate insulating film 28 is formed between the gate electrode and semiconductor region 41.

In the semiconductor device in FIG. 23, a channel region is formed on a top surface and a side surface of semiconductor region 41. Source/drain region 34 is formed on the opposite sides of semiconductor region 41 across the gate electrode. Semiconductor region 41, the gate electrode, gate insulating film 28, source/drain region 34 form one FinFET. Two FinFETs are provided on the semiconductor device in FIG. 23. The FinFETs share a part of the source/drain region.

Exemplary Embodiment

First, silicon semiconductor substrate 21 was prepared. The surface of silicon semiconductor substrate 21 was oxidized to form silicon oxide film 22. Then, a silicon nitride film was grown all over the surface of silicon oxide film 22. The silicon nitride film was thereafter dry etched by the lithography technique to form pattern 23 of the silicon nitride film (FIG. 13).

Then, silicon oxide film 22 was dry etched through pattern 23 of the silicon nitride film as a hard mask. Silicon semiconductor substrate 21 was then dry etched by 250 nm. A silicon oxide film was thereafter deposited all over the resulting surface and then flattened by the CMP process to form isolation region 24 (FIG. 14).

Then, pattern 23 of the silicon nitride film was removed by wet etching. A silicon nitride film was thereafter deposited all over the resulting surface to a thickness of 150 nm. The silicon nitride film was thereafter dry etched by the lithography technique using a resist mask to form mask pattern 25 of the silicon nitride film.

Then, silicon oxide film 22 was removed by dry etching through mask pattern 25 as a mask to expose silicon semiconductor substrate 21 (FIG. 15). Sacrifice oxide film 26 was formed on the exposed part of silicon semiconductor substrate 21 (FIG. 16).

Then, boron was implanted into silicon semiconductor substrate 21 through mask pattern 25 as a mask under conditions of an acceleration voltage of 30 keV and an implantation amount of $1 \times 10^{13}/cm^2$ (FIG. 17).

Then, sacrifice oxide film 26 was removed by wet etching to expose silicon semiconductor substrate 21 (FIG. 18). Dry oxidation was thereafter performed to form gate insulating film 28 of thickness 10 nm (FIG. 19). DOPOS (DOped POlycrystalline Silicon) was thereafter grown to form polysilicon film 29 of thickness 200 nm all over the resulting surface (FIG. 20).

Then, polysilicon film 29 was subjected to the CMP (Chemical Mechanical Polishing) process through mask pattern 25 of the silicon nitride film as a stopper.

Then, W (tungsten) film 30 and silicon nitride film 40 were deposited all over the resulting surface (FIG. 21). A part of W film 30 were reacted with a part of polysilicon film 29 (silicidized) to form WSi film 31 on polysilicon film 29, with W film 30 left on WSi film 31. Thus, a gate electrode 30, 31 and 29 made up of a laminate structure of the W layer (60 nm), WSi layer (30 nm), and polysilicon layer was formed.

Then, a silicon nitride film of thickness 200 nm was formed and then patterned to form the first mask 32 on the gate electrode. W film 30 on mask pattern 25 was then removed through the first mask 32 as a mask. Silicon nitride film (protect film) 33 of thickness 10 nm was thereafter formed all over the resulting surface. The entire resulting surface was then etched back so as to leave silicon nitride film 33 on a side surface of the gate electrode (FIG. 22).

Then, mask pattern 25 and silicon nitride film 33 on mask pattern 25 were removed. Impurities were implanted into silicon semiconductor substrate 21 through the first mask 32 as a mask to form source/drain region 34 (FIG. 23).

It is apparent that the present invention is not limited to the above embodiments, but may be modified and changed without departing from the scope and spirit of the invention.

What is claimed is:

1. A method for manufacturing a semiconductor device comprising a Fin field effect transistor, the method comprising a sequence of step comprising:
    (1) preparing a semiconductor substrate;
    (2) forming an oxide film on a surface of the semiconductor substrate;
    (3) forming an isolation region in the semiconductor substrate;
    (4) forming a mask pattern on the entire semiconductor substrate except for the isolation region;
    (5) etching the oxide film away through the mask pattern as a mask to expose the semiconductor substrate;
    (6) forming a sacrifice oxide film on a part of the semiconductor substrate exposed in (5);
    (7) implanting impurity into the semiconductor substrate through the mask pattern as a mask;
    (8) removing the sacrifice oxide film to expose the semiconductor substrate;
    (9) forming a gate insulating film on the exposed semiconductor substrate;
    (10) forming a polysilicon film on the gate insulating film;
    (11) performing a CMP process on the polysilicon film through the mask pattern as a stopper;
    (12) forming a metal film on the polysilicon film;
    (13) reacting at least a part of the metal film with at least a part of the polysilicon film to silicidize the metal to form a gate electrode of said Fin field effect transistor;
    (14) removing the mask pattern; and
    (15) implanting impurity into the opposite sides of the semiconductor substrate across the gate electrode to form a source/drain region.

2. The method for manufacturing a semiconductor device according to claim 1,
    wherein the semiconductor substrate is a silicon semiconductor substrate, and in (7), B, P, As, or $BF_2$ is implanted as the impurity.

3. The method for manufacturing a semiconductor device according to claim 1,
    wherein the metal is W, and
    in (13), a part of the W film are reacted with a part of the polysilicon film to silicidize the W to form the gate electrode of a laminate structure with the W layer, WSi layer, and polysilicon layer laminated in this order from above.

4. The method for manufacturing a semiconductor device according to claim 1,
    wherein the mask pattern comprise silicon nitride.

5. The method for manufacturing a semiconductor device comprising a plurality of the Fin field effect transistors according to claim 1,
    wherein in (13), a plurality of the gate electrodes are formed, and
    in (15), a plurality of the source/drain regions are formed.

6. A method for manufacturing a semiconductor device comprising a Fin field effect transistor, the method comprising a sequence of step comprising:
    (1) preparing a structure comprising a semiconductor substrate and an isolation region in the semiconductor substrate;
    (2) forming a mask pattern on the entire semiconductor substrate except for the isolation region;
    (3) forming a sacrifice oxide film on an exposed part of the semiconductor substrate which is not covered by a mask constituting the mask pattern;
    (4) implanting impurity into the semiconductor substrate through the mask pattern as a mask;
    (5) removing the sacrifice oxide film to expose the semiconductor substrate;
    (6) forming a gate insulating film on the exposed part of the semiconductor substrate;
    (7) forming a polysilicon film on the gate insulating film;
    (8) performing a CMP process on the polysilicon film through the mask pattern as a stopper;
    (9) forming a metal film on the polysilicon film;
    (10) reacting the metal film with the polysilicon film to silicidize the metal to form a gate electrode of said Fin field effect transistor;
    (11) removing the mask pattern; and
    (12) implanting impurity into the opposite sides of the semiconductor substrate across the gate electrode to form a source/drain region.

7. The method for manufacturing a semiconductor device according to claim 6,
    wherein the semiconductor substrate is a silicon semiconductor substrate, and in (4), B, P, As, or $BF_2$ is implanted as the impurity.

8. The method for manufacturing a semiconductor device according to claim 6,
    wherein the metal is W, and
    in (10), a part of the W film are reacted with a part of the polysilicon film to silicidize the W to form the gate electrode of a laminate structure with the W layer, WSi layer, and polysilicon layer laminated in this order from above.

9. The method for manufacturing a semiconductor device according to claim 6,
    wherein the mask pattern comprise silicon nitride.

10. The method for manufacturing a semiconductor device compositing a plurality of the Fin field effect transistors according to claim 6,
    wherein in (10), a plurality of the gate electrodes are formed, and
    in (12), a plurality of the source/drain regions are formed.

11. A method for manufacturing a semiconductor device comprising a Fin field effect transistor, the method comprising a sequence of step comprising:
    (1) preparing a projecting semiconductor region extending in a predetermined direction;

(2) forming a sacrifice oxide film on an intermediate portion of the semiconductor region in the predetermined direction;
(3) implanting impurity into a part of the semiconductor region under the sacrifice oxide film;
(4) removing the sacrifice oxide film to expose the semiconductor region;
(5) forming a gate insulating film on the exposed part of the semiconductor region;
(6) forming a polysilicon film and a metal film in order on the gate insulating film;
(7) reacting the metal film with the polysilicon film to silicidize the metal to form a gate electrode of said Fin field effect transistor; and
(8) implanting impurity into the opposite sides of the semiconductor region across the gate electrode in the predetermined direction to form a source/drain region.

12. The method for manufacturing a semiconductor device according to claim 11,
wherein the semiconductor region is a silicon semiconductor region, and in (3), B, P, As, or $BF_2$ is implanted as the impurity.

13. The method for manufacturing a semiconductor device according to claim 11,
wherein the metal is W, and
in (7), a part of the W film are reacted with a part of the polysilicon film to silicidize the W to form the gate electrode of a laminate structure with the W layer, WSi layer, and polysilicon layer laminated in this order from above.

14. The method for manufacturing a semiconductor device compositing a plurality of the Fin field effect transistors according to claim 11,
wherein in (7), a plurality of the gate electrodes are formed, and
in (9), a plurality of the source/drain regions are formed.

* * * * *